United States Patent
Sugar et al.

(10) Patent No.: US 6,728,517 B2
(45) Date of Patent: Apr. 27, 2004

(54) MULTIPLE-INPUT MULTIPLE-OUTPUT RADIO TRANSCEIVER

(75) Inventors: Gary L. Sugar, Rockville, MD (US); Robert M. Masucci, Potomac, MD (US); David G. Rahn, Kanata (CA)

(73) Assignee: Cognio, Inc., Gaithersburg, MD (US)

( * ) Notice: Subject to any disclaimer, the term of this patent is extended or adjusted under 35 U.S.C. 154(b) by 0 days.

(21) Appl. No.: 10/065,388

(22) Filed: Oct. 11, 2002

(65) Prior Publication Data

US 2003/0203743 A1 Oct. 30, 2003

Related U.S. Application Data

(60) Provisional application No. 60/319,434, filed on Jul. 30, 2002, provisional application No. 60/319,360, filed on Jun. 27, 2002, provisional application No. 60/319,336, filed on Jun. 21, 2002, provisional application No. 60/376,722, filed on Apr. 29, 2002, and provisional application No. 60/374,531, filed on Apr. 22, 2002.

(51) Int. Cl.[7] .................................................. H04B 1/38
(52) U.S. Cl. ........................ 455/73; 455/272; 455/552.1
(58) Field of Search .............................. 455/73, 76, 78, 455/83, 84, 86, 101, 132, 133, 137, 269, 272, 273, 266, 324, 340, 552.1, 553.1; 370/276, 277, 278; 375/219

(56) References Cited

U.S. PATENT DOCUMENTS

| | | |
|---|---|---|
| 4,580,289 A | 4/1986 | Enderby |
| 5,220,688 A | 6/1993 | Tao |
| 5,606,736 A | 2/1997 | Hasler et al. |
| 5,715,529 A | 2/1998 | Kianush et al. |
| 5,752,169 A | 5/1998 | Hareyama et al. ............ 455/76 |
| 5,758,265 A | 5/1998 | Okanobu |
| 5,832,375 A | 11/1998 | Leisten et al. |
| 5,878,332 A | 3/1999 | Wang et al. |
| 5,966,666 A * | 10/1999 | Yamaguchi et al. ...... 455/552.1 |
| 5,974,306 A | 10/1999 | Hornak et al. |
| 6,125,266 A * | 9/2000 | Matero et al. ........... 455/553.1 |
| 6,252,548 B1 | 6/2001 | Jeon ........................... 342/383 |
| 6,259,895 B1 | 7/2001 | Yoshikawa et al. |
| 6,282,413 B1 | 8/2001 | Baltus |
| 6,351,502 B1 | 2/2002 | Zargari |
| 6,477,148 B1 | 11/2002 | Gardenfors et al. |
| 2001/0015994 A1 | 8/2001 | Nam |
| 2003/0035491 A1 | 2/2003 | Walton et al. ............... 375/267 |

OTHER PUBLICATIONS

Rudell et al., "Hiughly Integrated Transceiver Architectures for Adaptive RF Communications," University of California, Berkley, date unknown.

Behbahani et al., "An All CMOS, 2.4 GHz, Full Adaptive, Scalable, Frequency Hopped Transceiver" University of California, Los Angelese, Integrated Circuit & Systems Laboratory, date unknown.

(List continued on next page.)

Primary Examiner—Quochien B. Vuong
(74) Attorney, Agent, or Firm—D. Andrew Floam, Esq.

(57) ABSTRACT

A MIMO radio transceiver to support processing of multiple signals for simultaneous transmission via corresponding ones of a plurality of antennas and to support receive processing of multiple signals detected by corresponding ones of the plurality of antennas. The radio transceiver provides, on a single semiconductor integrated circuit, a receiver circuit or path for each of a plurality of antennas and a transmit circuit or path for each of the plurality of antennas. Each receiver circuit downconverts the RF signal detected by its associated antenna to a baseband signal. Similarly, each transmit path upconverts a baseband signal to be transmitted by an assigned antenna.

65 Claims, 11 Drawing Sheets

OTHER PUBLICATIONS

Ellingson et al., "An 8–Element Dual–Frequency Array Receiver for Propagation Measurements near 2.4 GHz," The Ohio State University ElectroScience Laboratory, Jul., 2001.

Gozali et al., Virginia Tech Space–Time Advanced Radio (VT–STAR), Proceedings, Radio and Wireless Conference (RAWCON) 2001.

"Parkervision Announces Successful Development of Most Integrated High Performace Wireless LAN Transceiver Chips Current Available," Jul. 30, 2002.

PV–1000Hb 802.11b RF Transceiver Product Specification, 2002, pp. 1–11.

Madihian, et al., "A 5 GHz–Band Multifunctional BiCMOS Transceiver Chip for GMSK Modulation Wireless Systems," IEEE Journal of Solid–State Circuits, vol. 34, No. 1, Jan., 1999.

Rudell et al., "Recent Developments in High Integration Multi–Standard CMOS Transceiver for Personal Communication Systems," 1998 International Symposium on Lower Power Electronics, Monterey, California.

Cho et al., "Multi–Standard Monolithic CMOS RF Transceiver," University of California, Berkeley, Jan. 8, 1996, (pp. 1–26).

Cho et al., "Multi–Standard Monolithic CMOS RF Transceiver," University of California, Berkley, Jun. 16, 1996.

Rudell et al., "Second Generation Multi–Standard Monolithic CMOS RF Transceiver," University of California, Berkeley, Jun. 16, 1996.

Lantz, "A 5GHz, SiGe, Monolithic WLAN Transceiver", PCC Workshop, 1999.

Copeland et al., "5GHz SiGe HBT Monolithic Radio Transceiver with tunable filtering", IEEE Trans on Microwave Theory and Techniques, Feb. 2000, vol. 48, No. 2.

Single Chip Bluetooth Radio Transceiver, STMicroelectronics, 2001, (2 pages).

International Search Report in International Application No. PCT/US03/12183.

* cited by examiner

MULTIPLE-INPUT MULTIPLE-OUTPUT RADIO TRANSCEIVER

BACKGROUND OF INVENTION

This application claims priority to the following U.S. Provisional Patent Applications (the entirety of each of which is incorporated herein by reference):

Application No. 60/374,531, filed Apr. 22, 2002;
Application No. 60/376,722, filed Apr. 29, 2002;
Application No. 60/319,336, filed Jun. 21, 2002;
Application No. 60/319,360, filed Jun. 27, 2002; and
Application No. 60/319,434, filed Jul. 30, 2002.

The present invention relates to a multiple-input multiple-output (MIMO) radio transceiver.

A primary goal of wireless communication system design is to use the available spectrum most efficiently. Examples of techniques to increase spectral efficiency include coded modulation techniques such as turbo codes and trellis-coded modulation, and multiple access techniques such as code division multiple access (CDMA).

Yet another way to optimize spectral efficiency that has recently become popular in the academic community is the use of MIMO radio systems. MIMO radio communication techniques have been proposed for use in, for example, 3G mobile telephone systems. However, prior efforts to exploit the benefits of a MIMO system have failed because, among other reasons, a cost-effective MIMO radio could not be developed.

SUMMARY OF INVENTION

A MIMO radio transceiver is provided to support processing of multiple signals for simultaneous transmission via corresponding ones of a plurality of antennas and to support receive processing of multiple signals detected by corresponding ones of the plurality of antennas. The MIMO radio transceiver is one that is suitable for a highly integrated and low cost fabrication. In addition, the radio transceiver can perform MIMO transmit and receive operation in a portion of an RF band, up to substantially the entire RF band. The multiple transmit and receive paths are particularly useful to support joint maximal ratio combining techniques, also referred to herein as composite beamforming (CBF).

The radio transceiver provides, on a single semiconductor integrated circuit, a receiver circuit or path for each of a plurality of antennas and a transmit circuit or path for each of the plurality of antennas. Each receive path downconverts the RF signal detected by its associated antenna to a baseband signal, using either a direct-conversion process or a super-heterodyne (multiple conversion) process. Similarly, each transmit circuit upconverts a baseband signal to be transmitted by an assigned antenna, using either a direct up-conversion process or a multiple-stage conversion process.

The multiple receive and transmit paths are integrated onto the same semiconductor integrated circuit. This provides significant cost and space/area savings. One use of this type of radio transceiver is to receive and transmit signals that, at baseband, are processed using the aforementioned CBF techniques (whereby weighted components of a signal are sent via each of a plurality of antennas and received at the other device by one or more antennas) to enhance the link margin with another communication device. In such an application, it is very important that each of the receive processing paths and each of the transmit processing paths be matched in terms of amplitude and phase response. Because the multiple receive and transmit paths are integrated into a single semiconductor die, the processing paths will inherently be better phase and amplitude matched, and any effects resulting from semiconductor integration will track among the processing paths. Moreover, any operational changes due to temperature variations will also better track among the processing paths because they are integrated into the same semiconductor integrated circuit.

Low cost radio transceiver solutions are provided that, for example, do not require intermediate frequency (IF) filters, have power amplifiers integrated on the radio transceiver integrated circuit (IC), use one frequency synthesizer, and integrate various control switches for transmit/receive and band select operations.

The above and other advantages will become more apparent with reference to the following description taken in conjunction with the accompanying drawings.

DETAILED DESCRIPTION

Figure 1:
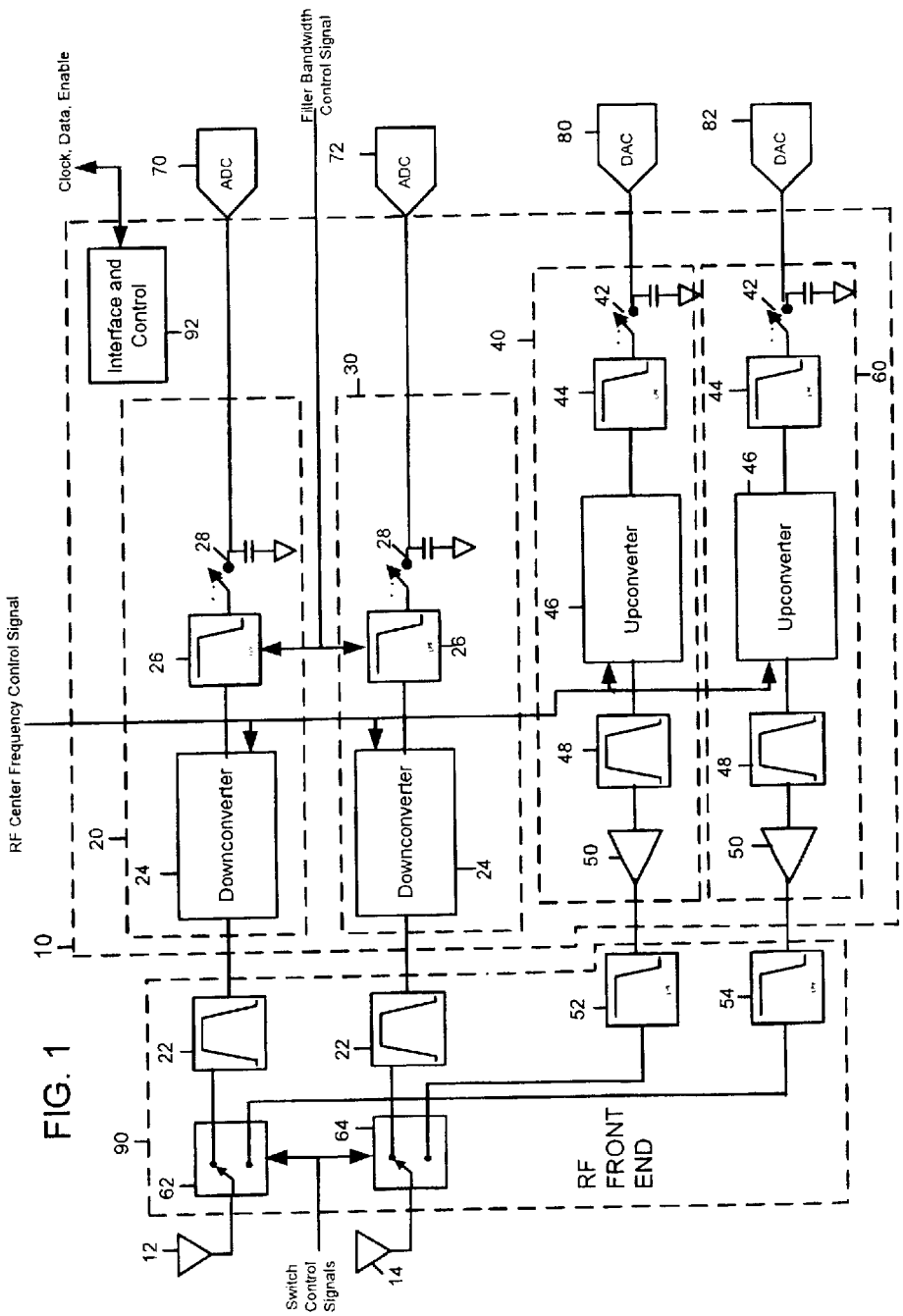
FIG. 1 is a general block diagram of a radio transceiver having multiple processing paths for multiple-input multiple-output (MIMO).

FIG. 1 shows a block diagram of a radio transceiver 10. The radio transceiver 10 is suitable for processing radio frequency signals detected by at least two antennas. The foregoing description is directed to an embodiment with two antennas 12 and 14, and an associated transmit and receive path for each, but this same architecture can be generalized to support in general N processing paths for N-antennas. This radio transceiver architecture is useful to support the aforementioned CBF techniques. CBF systems and methods are described in U.S. patent application Ser. No. 10/164,728, filed Jun. 19, 2002 entitled "System and Method for Antenna Diversity Scheme Using Joint Maximal Ratio Combining"; U.S. patent application Ser. No. 10/174,689, filed Jun. 19, 2002, entitled "System and Method for Antenna Diversity Using Equal Gain Joint Maximal Ratio Combining"; and U.S. patent application Ser. No. 10/064,482, filed Jul. 18, 2002 entitled "System and Method for joint Maximal Ratio Combining Using Time-Domain Signal Processing." These co-pending and commonly assigned patent applications all relate to optimizing the received SNR at one communication based on the transmit vector used at the other communication device.

One advantage of the technology described in the aforementioned patent application entitled "System and Method for Antenna Diversity Using Equal Gain Joint Maximal Ratio Combining" is that the output power required from each antenna path is reduced. Therefore, the size of the power amplifiers can be reduced, which reduces the overall semiconductor chip area of the IC, and makes it easier to isolate other RF circuitry on the IC from the power amplifiers.

The radio transceiver 10 comprises a receiver and a transmitter. The receiver comprises receiver circuits 20 and 30. There is a receiver circuit or section 20 for antenna 12 and a receive circuit or section 30 for antenna 14. Similarly, the transmitter comprises a transmit circuit 40 for antenna 12 and a transmit circuit 60 for antenna 14. Each receiver circuit 20 and 30 includes a downconverter 24, a variable lowpass filter 26 and a sample-and-hold circuit 28. Each transmit circuit 40 and 60 includes a sample-and-hold circuit 42, a low pass filter 44, an upconverter 46, a bandpass filter 48 and a power amplifier 50. The downconverters 24 may involve circuits to perform single-stage (direct) conversion to baseband or two-stage conversion to an intermediate frequency, then to baseband. Likewise, the upconverters 46 may upconvert directly to RF or to an intermediate frequency, then to RF. More specific embodiments are described hereinafter in conjunction with FIGS. 2–4. The lowpass filters 44 may be variable filters to accommodate transmission of signals in a variable bandwidth, similar to the variable bandwidth receiver operation.

A front-end section 90 couples the radio transceiver 10 to antennas 12 and 14. There are switches 62 and 64 coupled to antennas 12 and 14, respectively. Switch 62 selects whether the output of the transmit circuit 60 or the input to the receiver circuit 20 is coupled to antenna 12. Switch 64 selects whether the output of the transmit circuit 40 or the input of the receiver path 30 is coupled to antenna 14. There are bandpass filters 22 coupled to one switch terminal of the switches 62 and 64, respectively. In addition, there are lowpass filters 52 and 54 coupled between the output of the power amplifiers 50 in each transmit circuit 40 and 60, and, the other switch terminal of the switches 62 and 64, associated with antennas 12 and 14, respectively.

The outputs of the sample-and-hold circuits 28 of receiver circuits 20 and 30 are coupled to analog-to-digital converters (ADCs) 70 and 72, respectively. The inputs to the sample-and-hold circuits 42 in the transmit circuits 40 and 60 are coupled to digital-to-analog converters (DACs) 80 and 82, respectively. The DACs 80 and 82 may receive as input first and second digital baseband transmit signals representing complex-weighted transmit signal components of a single baseband signal to be transmitted simultaneously from antennas 12 and 14. The first and second transmitter circuits 40 and 60 process the first and second analog baseband signals. for transmission substantially simultaneously. Likewise, antennas 12 and 14 may detect first and second receive signals, respectively, which are components of a single signal that was transmitted to transceiver 10. The first receiver circuit 20 and the second receiver circuit 30 process the first and second receive signals substantially simultaneously to allow for a weighted combining of the resulting digital baseband receive signals.

An interface and control block 92 is provided that interfaces the radio transceiver 10 with other components, such as a baseband processing section. For example, the interface and control block 92 receives a filter bandwidth control signal, a center frequency control signal, and switch control signals, all of which are used to control operation of certain components in the radio transceiver. Alternatively, the aforementioned signals may be sourced for a control processor or baseband section and coupled directly to pins that are tied to the appropriate components of the transceiver 10.

The center frequency control signal controls the center frequency of the local oscillator signals (not shown) used by the downconverters 24 in each receiver circuit 20 and 30 and of the upconverters 46 in each transmit circuit 40 and 60. In addition, the filter bandwidth control signal controls the cut-off frequency of the variable lowpass filters 26 (and optionally the lowpass filters 44 as well) for receiving signals or transmitting signals of different bandwidths. The switch control signals control the position of the switches 62 and 64 depending on whether the transceiver 100 is receiving or transmitting.

One distinctive function of the radio transceiver 10 is to simultaneously receive and process signals detected by each antenna 12 and 14, in order to output first and second baseband receive signals that are combined appropriately using the aforementioned CBF techniques (in a baseband processor) to obtain a received signal.

Conversely, the radio transceiver 10 simultaneously processes first and second baseband analog transmit signals (representing weighted components of a single transmit signal) and outputs them for transmission via antennas 12 and 14, respectively. The radio transceiver 10 shown in FIG. 1 can be operated in a half-duplex mode or, if desired, a full-duplex mode.

Moreover, the radio transceiver 10 may perform MIMO operation in a variable bandwidth. For example, the radio transceiver 10 may transmit or receive a signal in a single RF channel in a radio frequency band, such as a 20 MHz 802.11 channel of the 2.4 GHz band. However, it may also perform MIMO operation to transmit or receive a signal in a wider bandwidth, such as a higher data rate signal or signals that occupy up to substantially an entire frequency band, such as 80 MHz of the 2.4 GHz band.

The filter bandwidth control signal sets the cut-off frequency of the lowpass filters 26 in each receiver circuit 20 and 30 to lowpass filter the desired portion of RF bandwidth. The radio transceiver 10 also has a receive-only non-MIMO operation where the output of either receive path can be taken to sample any part or the entire RF band, by adjusting the lowpass filters 26 accordingly. This latter functionality is useful to obtain a sample of a RF band to perform spectrum analysis of the RF band.

As is explained in further detail in connection with FIGS. 13 and 14, the lowpass filters 44 in the transmitter may be eliminated and the variable lowpass filters 28 used for both received signals and transmit signals.

The large dotted box around the receiver circuits 20 and 30 and the transmit circuits 40 and 60 is meant to indicate that all of these components, including the power amplifiers 50, may be implemented on a single semiconductor integrated circuit (IC). Other components may also be implemented on the IC as semiconductor and filter design technology allows. The performance advantages achieved by integrating-multiple transmit paths and multiple receive paths on the same semiconductor are described above.

Figure 2:
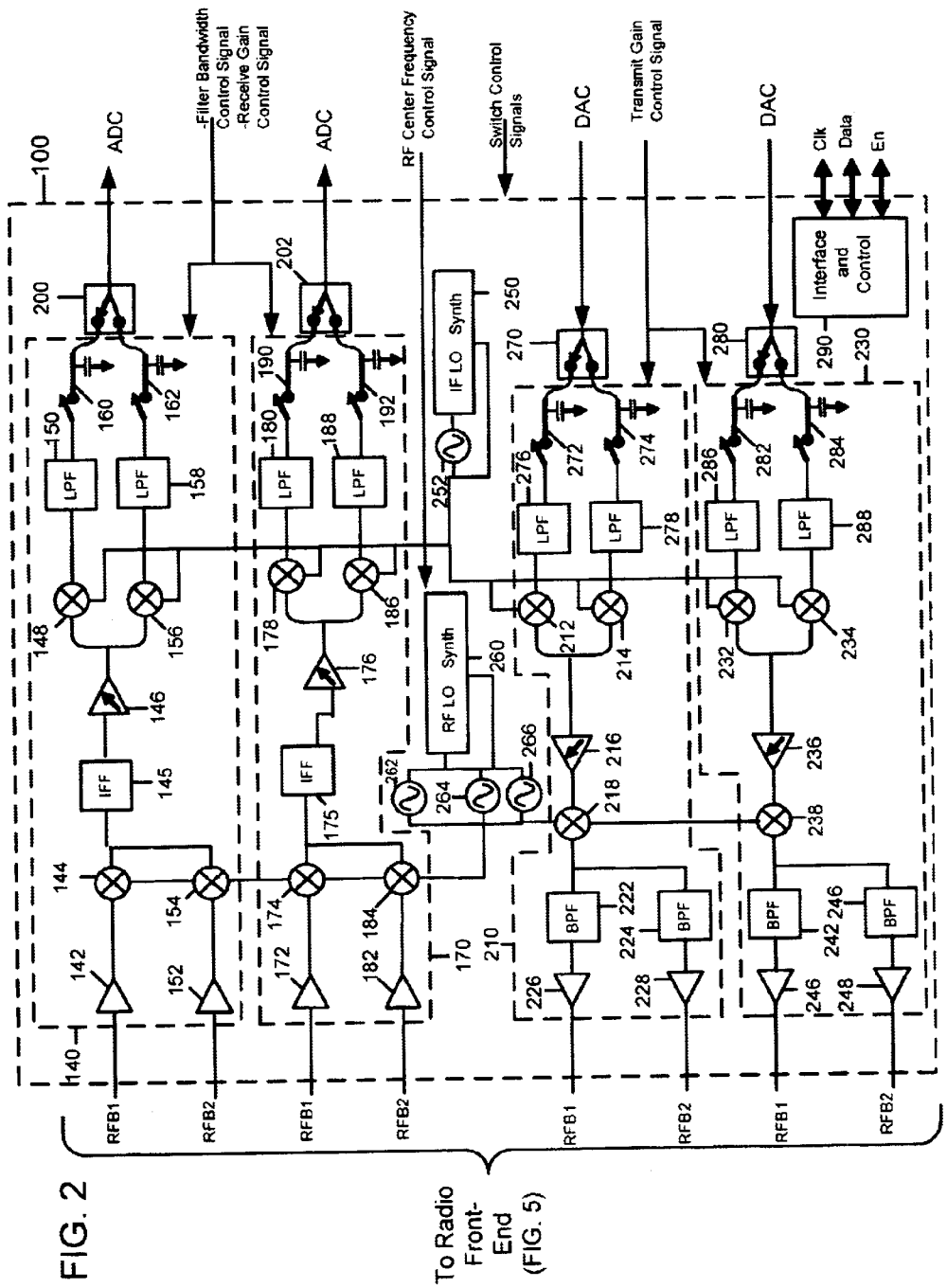
FIG. 2 is a schematic diagram of a MIMO radio transceiver having a super-heterodyne architecture.
Figure 3:
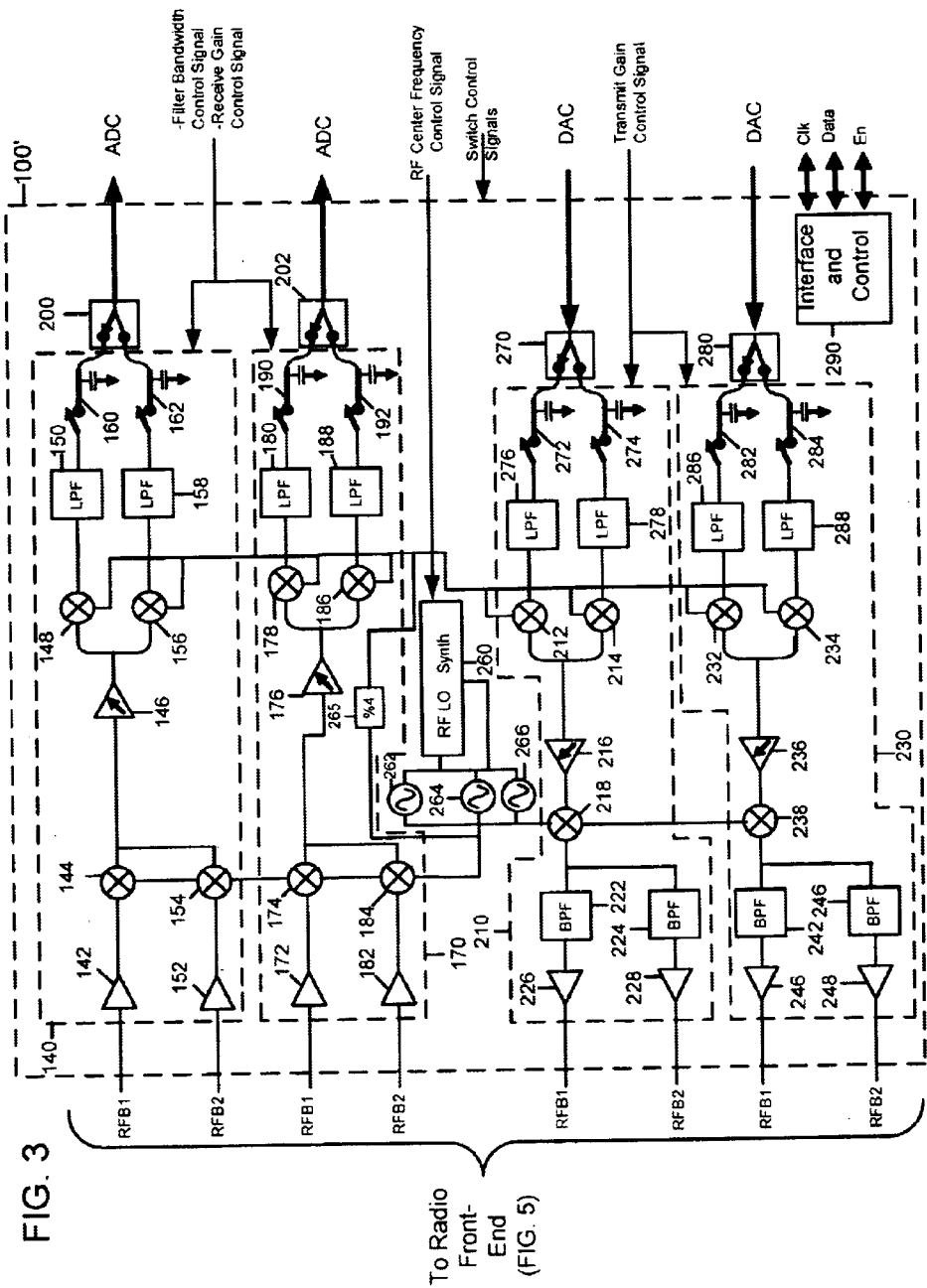
FIG. 3 is a schematic diagram of a MIMO radio transceiver having a variable intermediate frequency architecture.
Figure 4:
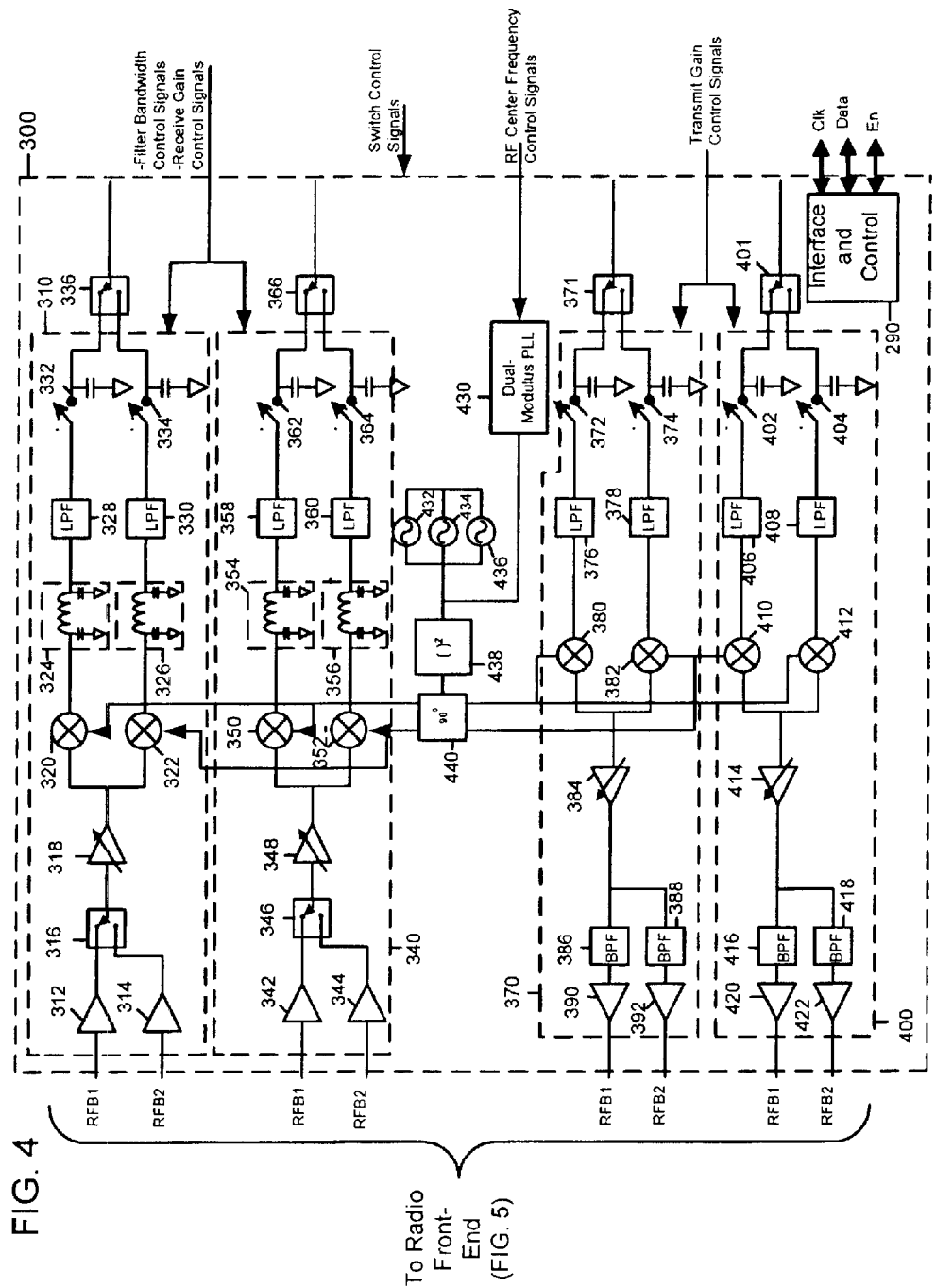
FIG. 4 is a schematic diagram of a MIMO radio transceiver having a direct-conversion architecture.
Figure 5:
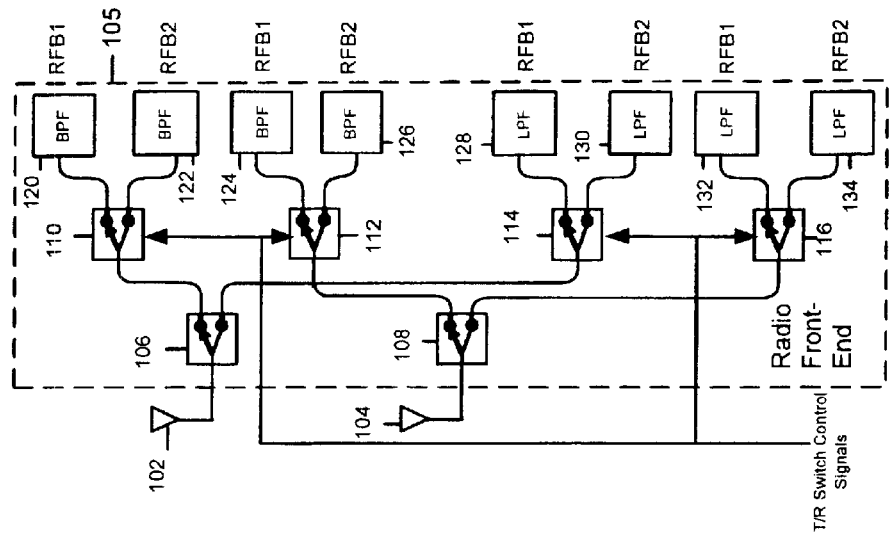
FIG. 5 is a schematic diagram of radio front-end section useful with a MIMO radio transceiver.

FIGS. 2–4 show more specific examples of the MIMO radio transceiver shown in FIG. 1. FIG. 2 shows a dual-band radio transceiver employing a super-heterodyne (two-stage) conversion architecture. FIG. 3 shows a dual-band radio transceiver employing a walking intermediate frequency (IF) conversion architecture using only one frequency synthesizer. FIG. 4 shows a dual-band radio transceiver employing a direct conversion (single-stage) architecture. FIG. 5 illustrates a radio-front end section that can be used with any of the radio transceivers shown in FIGS. 2–4.

With reference to FIG. 2 in conjunction with FIG. 5, radio transceiver 100 will be described. The radio transceiver 100 shown in FIG. 2 is a super-heterodyne receiver that is capable of operating in two different frequency bands, such as, for example, the 2.4 GHz unlicensed band and one of the 5 GHz unlicensed bands. and second antennas 102 and 104 via a RF front end section 105 that includes transmit/receive (T/R) switches 106 and 108, which couple to antennas 102 and 104, respectively. Each T/R switch 106 and 108 has an antenna terminal to be coupled to its associated antenna, a receive output terminal and a transmit input terminal and is responsive to T/R switch control signals to select either the receive output terminal or the transmit input terminal, depending on whether the radio transceiver is transmitting or receiving. Also in the RF front end section 105 are band select switches 110, 112,114 and 116 that select the output of the antenna from switches 106 and 108 depending in which frequency band a signal is being transmitted or received. Band select switches 110 and 112 are receive band select switches, each of which has an input terminal coupled to the receive output terminals of the first and second T/R switches 106 and 108, respectively, and a first output terminal coupled to the BPFs 120 and 124 respectively, and a second output terminal coupled to the BPFs 122 and 126 respectively. Band select switches 114 and 116 are transmit band select switches and each has first and second input terminals and an output terminal. The first input terminals of band select switches 114 and 116 are connected to LPFs 128 and 132, respectively, and the second input terminals of switches 115 and 116 are connected to LPFs 130 and 134, respectively. The output terminals of switches 114 and 116 are coupled to the transmit input terminals of the first and second T/R switches 106 and 108, respectively.

Referring back to FIG. 2, on the receive side of the radio transceiver 100, there is a receiver comprising a receiver path or circuit 140 associated with signals detected by antenna 102 and a receiver path or circuit 170 associated with signals detected by antenna 104. On the transmit side, there is a transmitter comprising a transmit path or circuit 210 associated with antenna 102 and a transmit path or circuit 230 associated with antenna 104. Each of the receiver circuits 140 and 170 has two branches: a first branch to process a signal from a first radio frequency band, and a second branch to process a signal from a second radio frequency band.

More specifically, each branch in the receiver circuits 140 and 170 is coupled to a corresponding one of the bandpass filters 120, 122, 124 or 126 in the RF front end section 105 shown in FIG. 5. In a first branch of the receiver circuit 140, there is a low noise amplifier (LNA) 142 and an RF mixer 144 to downconvert an RF signal from a first radio frequency band (RFB1) to an intermediate frequency (IF). In a second branch of the receiver circuit 140 there is an LNA 152 and an RF mixer 154 that downconverts an RF signal from a second radio frequency band to IF. An IF filter (IFF) 145 is coupled to the mixer 144 and to the mixer 154, and on the output side of the IFF 145 is a variable amplifier 146, quad mixers 148 and 156 and a variable lowpass filters 150 and 158. A sample-and-hold circuit 160 is coupled to variable lowpass filter 150 and a sample-and-hold circuit 162 is coupled to variable lowpass filter 158. As will be described in more detail hereinafter, the first branch of receiver circuit 140 (consisting of LNA 142 and mixer 144) processes a signal from a first RF band (RFB1) detected by antenna 102. The second branch of receiver circuit 140 (consisting of amplifier 152 and mixer 154) processes a signal from a second RF band (RFB2) detected by antenna 102. Only one of the branches of receiver circuit 140 is operating at any given time. As a result, the IFF 145 and the variable power amplifier 146 can be shared by the branches (without the need for an additional switch) assuming the output impedance of the mixers 144 and 154 is high. The quad mixers 148 and 156 generate an in-phase signal (I) and a quadrature-phase (Q) signal of the signal supplied to the input of the variable amplifier 146. Thus, to summarize, the receiver circuit 140 has a first downconverter consisting of an RF mixer (144 or 154, depending on what band branch is being used) that down-mix a first receive signal detected by antenna 102 (FIG. 5) to an intermediate frequency signal, and quad mixers 148 and 156 that further down-mix the intermediate frequency signal to I and Q baseband analog signals.

The receiver circuit 170 has components 172 through 192 that mirror those in the receiver circuit 140, but are used to process a signal from antenna 104 (FIG. 5) in either the first RF band (RFB1) or the second RF band (RFB2). Like receiver circuit 140, receiver circuit 170 has a second downconverter consisting of an RF mixer (174 or 184, depending on what band branch is being used) that down-mixes a second receive signal detected by antenna 104 to a second intermediate frequency signal at the same IF as the first intermediate frequency signal produced in receiver circuit 140, and quad mixers 178 and 186 that further down-mix the second IF signal to I and Q baseband analog signals.

Switches 200 and 202 are coupled to the sample-and-hold circuits in receiver circuits 140 and 170, respectively, to switch between the I and Q outputs associated with the first and second analog baseband receive signals output by receiver circuit 140 and receiver circuit 170, respectively, for processing by an ADC. In addition, switches 270 and 280 serve the additional function on the transmit side to receive as input the output of DACs that supply first and second analog baseband signals to be transmitted.

On the transmit side of the radio transceiver 100 there are two transmit circuits 210 and 230. In transmit circuit 210, there are quad mixers 212 and 214 coupled to receive as input the I and Q data signals, respectively, that up-mix these signals by an intermediate frequency local oscillator signal to an IF. The outputs of the quad mixers 212 and 214 are summed and coupled to the variable amplifier 216, which in turn is coupled to an RF mixer 218. The RF mixer 218 upconverts the intermediate frequency signal to RF, in either RFB1 or RFB2. Bandpass filters 222 and 224 are coupled to the output of the mixer 218. Bandpass filter 222 is associated with RFB1 and bandpass filter 224 is associated with RFB2. There is a power amplifier 226 coupled to the output of the bandpass filter 222 and a power amplifier 228 coupled to the output of bandpass filter 228. The output of power amplifier 226 is coupled to the input of the lowpass filter 128 (FIG. 5) and the output of power amplifier 228 is coupled to the input of the lowpass filter 130 (FIG. 5). To summarize, the first transmit circuit 210 has an upconverter consisting of the quad mixers 212 and 214 that up-mix the baseband I and Q signals representing the first transmit signal, and the RF mixer 218 that further up-mixes the intermediate frequency signal to produce a first RF signal that is to be coupled to the first antenna 102 (FIG. 5). The output of the RF mixer 218 is coupled to bandpass branches consisting of BPF 222 and power amplifier 226 or BPF 224 and power amplifier 228.

The transmit circuit 230 associated with antenna 104 has components 232 through 248 and mirrors transmit circuit 210 to process a second transmit signal component. Similar to the first transmit circuit 210, the second transmit circuit 230 has an upconverter consisting of quad mixers 232 and 234 that up-mix I and Q baseband signals representing the second transmit signal, and an RF mixer 238 that further-up mixes the intermediate frequency signal to produce a second RF signal is coupled to the second antenna 104 (FIG. 5) for transmission substantially simultaneous with the first RF signal.

The input signals to the transmitter circuits 210 and 230 are supplied from DACs (not shown) to switches 270 and 280 that alternately select between baseband I and Q signals, which are coupled to respective sample-and-hold circuits 272 and 274 (in transmitter circuit 210) and sample-and-hold circuits 282 and 284 in transmitter circuit 230. Sample-and-hold circuits 272 and 274 are in turn coupled to LPFs 276 and 278, respectively, and sample-and-hold circuits 282 and 284 are coupled to LPFs 286 and 288, respectively. LPFs 276 and 278 filter the baseband I and Q signals of the first transmit signal and supply their output to the quad mixers 212 and 214, respectively. Likewise, the LPFs 282 and 288 filter the baseband I and Q signals of the second transmit signal and supply their output to the quad mixers 232 and 234, respectively. The number of LPFs may be reduced if the variable LPFs in the receiver are used for both receive processing and transmit processing. One technique for sharing the variable LPFs for transmit and receive operation is shown in FIGS. 13 and 14.

Since radio transceiver 100 is a super-heterodyne device, RF local oscillator signals for the radio frequencies associated with RFB1 and RFB2 and IF local oscillator signals need to be generated. To this end, there is an IF synthesizer (IF LO synth) 250 and a voltage controlled oscillator (VCO) 252 (including a 90° phase component, not shown for simplicity) to generate in-phase and quadrature phase IF local oscillator signals that are coupled to the mixers 148, 156, 178 and 186, and to mixers 212, 214, 232 and 234. There is an RF local oscillator synthesizer (RF LO synth) 260 coupled to VCOs 262, 264 and 266 that supply different RF local oscillator signals to mixers 144, 154, 174 and 184 on the receive side and to mixers 218 and 238 on the transmit side. There are multiple VCOs to supply RF signals for the multiple RF bands. For example, VCO 262 supplies an RF local oscillator signal (for any RF channel in or the center frequency) for the 2.4 GHz unlicensed band, VCO 264 supplies an RF local oscillator signal (for any RF channel in or the center frequency) for the low 5 GHz unlicensed band, and VCO 266 supplies an RF local oscillator signal (for any RF channel in or the center frequency) for the high 5 GHz unlicensed band.

An interface and control block 290 interfaces a clock signal, data signals and an enable signal to/from an external device, such as a baseband processor and/or a control processor. Transceiver control signals sourced from an external device may be coupled to the appropriate transceiver components through the interface control block 290 or coupled to pins that are tied to the appropriate components. The transceiver control signals include, for example, an RF center frequency control signal, a filter bandwidth control signal, a transmit gain adjustment signal, a receive gain adjustment signal and switch control signals. The RF center frequency control signal controls which RF band, and the particular RF channel in that band, for which the RF LO synthesizer 260 and associated VCOs 262, 264 or 267 outputs a local oscillator signal. An example of a frequency synthesizer suitable for use with the radio transceivers described herein is disclosed in commonly assigned U.S. Provisional Application No. 60/319,518, filed Sep. 4, 2002, and entitled "Frequency Synthesizer for Multi-Band Super-Heterodyne Transceiver Applications." The filter bandwidth control signal controls the cut-off frequencies of the variable lowpass filters 150, 158, 180 and 188 in the receiver or the cut-off frequencies of the variable lowpass filters 276, 278, 286 and 288 in the transmitter. The transmit gain control signals control the gain of the variable amplifiers 216 and 236 on the transmit side and the receive gain control signals control the gain of the variable amplifiers 146 and 176 on the receive side. The switch control signals control the position of the switches 106, 108, 110, 112, 114, 116, 200 and 202 according to the operating mode of the radio transceiver 100 and the frequency band of operation.

The majority of the components of the radio transceiver 100 are implemented in a semiconductor IC. The large dotted line indicates those components that may be included in the IC; however, additional components may be implemented in the IC.

With reference to FIGS. 2 and 5, operation of the transceiver 100 will be described. For example, RFB1 is the 2.4 GHz unlicensed band and RFB2 is one of the 5 GHz unlicensed bands. It should be understood that the same architecture shown in FIG. 2 can be used for other applications, and that the 2.4/5 GHz dual band application is only an example. For purposes of this example, the IF is 902.5 MHz, and the frequency output by the IF LO synth 250 is 1805 MHz; the RF LO synthesizer outputs an RF local oscillator signal that ranges from 3319.5 MHz to 4277.5 MHz. The variable lowpass filters 150, 158, 180 and 188 are controllable to filter a variety of bandwidths in the RF band, for example to facilitate MIMO receive processing of signals detected by the antennas 102 and 104 in 20 MHz of bandwidth up to 80 MHz or 100 MHz of bandwidth. Similarly, the variable lowpass filters 276, 278, 286 and 288 are controllable (by the filter bandwidth control signal) to filter a variety of bandwidths in the RF band, for example to facilitate MIMO transmit processing of baseband signals to be transmitted in 20 MHz of bandwidth up to 80 MHz or 100 MHz of bandwidth.

Alternatively, and as described hereinafter in conjunction with FIGS. 13 and 14, the variable lowpass filters 150, 158, 180 and 188 may be shared for receive processing and transmit processing. Generally, the radio transceiver 100 is operated in a half-duplex mode during which it does not simultaneously transmit and receive in either RFB1 or RFB2.

The radio transceiver 100 may also be operated in a non-MIMO configuration. For example, the output of only one receive path may be used with the appropriate variable lowpass filter set to, sample any portion or all of the desired RF band for obtaining data to analyzing some or all of the spectrum of that RF band.

The T/R switches and band select switches in the RF front-end section 105 (FIG. 5) are controlled according to whether the radio transceiver is transmitting or receiving, and in which RF band it is operating.

For example, when the radio transceiver 100 is receiving in RFB1, switches 106 and 108 are moved to their top positions to select the receive side of the transceiver 100.

The RF LO synthesizer 260 is controlled to output RF local oscillator signals that will downconvert a particular (subband) from RFB1. Switches 110 and 112 are moved to their top positions to select bandpass filters 120 and 124 (associated with RFB1) and corresponding branches of the receiver circuits 140 and 170. Filter 120 bandpass filters the signal detected by antenna 102 and filter 124 bandpass filters the signal detected by antenna 104. The lowpass filters 150, 158, 180 and 188 are controlled to operate in the desired bandwidth. The two signals detected by antennas 102 and 104 may be spatially diverse signal components of the same transmit signal. The signal from antenna 102 is downconverted to IF by mixer 144, filtered by the IF filter 145, then downconverted to baseband I and Q signals by quad mixers 148 and 156 and filtered by lowpass filters 150 and 158. Each I and Q signal derived from this signal is sample-and-held and alternately selected for output to an ADC by switch 200. The receiver circuit 170 performs a similar operation for the signal detected by antenna 104.

The radio transceiver 100 performs MIMO transmit operation in a similar manner. The LPFs 276, 278, 286 and 288 in the transmitter (or the shared LPFs of the receiver) are controlled to filter the desired bandwidth. In addition, the RF LO synth 260 is controlled to output an RF local oscillator signal according to which frequency band the signals are to be transmitted. Assuming a signal is to be transmitted on a channel in RFB2, the switches 106 and 108 are moved to their bottom positions, selecting the transmit side of the radio transceiver 100. The switches 114 and 116 are moved to their bottom positions, selecting the branch of transmit circuits 210 and 230 associated with RFB2. The analog baseband signal to be transmitted consists of first and second signal components, to be transmitted simultaneously by the respective antennas 102 and 104. The appropriate RF local oscillator signal is output to the mixers 218 and 238. The I and Q signals of a first transmit signal component are upconverted to IF by quad mixers 212 and 214. The variable amplifier 216 adjusts the gain of the resulting IF signal, and the mixer 218 upconverts the IF signal to RF. The filter 224 bandpass filters the RF signal output by the mixer 218 and the power amplifier 228 amplifies the output of the bandpass filter 224. Lowpass filter 130 filters the harmonics of the output of the power amplifier 228, and the resulting output is coupled to the antenna 102 via switches 114 and 106. A similar operation occurs for the I and Q signals of the second transmit signal component. The bandpass filter 246 filters the RF signal and the power amplifier 248 amplifies the filtered signal, which is then coupled to the lowpass filter 134. The resulting filtered signal is coupled to antenna 104 via switches 116 and 108.

FIG. 3 shows a radio transceiver 100' that is similar to radio transceiver 100 except that it employs a variable or walking IF architecture, rather than a super-heterodyne architecture. Particularly, in the receiver circuits of the radio transceiver 100', the received RF signal is down-mixed to an intermediate frequency that depends on the RF local oscillator signal, and an IF filter is not needed or is optional. A similar principle applies for the transmit circuits. Therefore, the RF local oscillator signal output of the RF LO synthesizer 260 is coupled to a divide-by-four circuit 265 which in turn supplies an IF local oscillator signal to mixers 148 and 156 in receiver circuit 140, mixers 178 and 186 in receiver circuit 170, mixers 212 and 214 in the transmit circuit 210 and mixers 232 and 234 in the transmit circuit 230. The divide-by-four circuit 265 generates the IF local oscillator signal based on the RF local oscillator signal supplied by the RF LO synthesizer 260. No IF filters are needed and only a single synthesizer (for the RF local oscillator signal) is required. Otherwise, the operation of the radio transceiver 100' is similar to that of radio transceiver 100.

The radio transceivers of FIGS. 2 and 3 have certain advantages that make them suitable for highly integrated and low cost implementations. First, the super-heterodyne architecture of FIG. 2 and the walking IF architecture of FIG. 3 allow for integrating the power amplifiers in the transmitter of the radio transceiver IC. This is because the power amplifier output frequency falls significantly outside the VCO turning range, thereby avoiding injection locking of the VCO. This is not as easily possible in other architectures, such as the direct conversion architecture shown in FIG. 4. Second, the walking IF transceiver of FIG. 3 does not require an IF filter which reduces the bill of materials cost of the radio transceiver. Even the super-heterodyne design of FIG. 2 can be implemented without an IF filter under certain design parameters. The design of FIG. 3 has both the advantage of more easily integrating the power amplifiers as well as not requiring an IF filter. Therefore, the radio transceiver design of FIG. 3 may be desirable where cost, integration and IC size are important.

Referring now to FIG. 4, a direct-conversion radio transceiver architecture 300 is described. Like radio transceiver 100, radio transceiver 300 has multiple receiver circuits 310 and 340 in the receiver and multiple transmit circuits 370 and 400 in the transmitter. The receiver circuits are identical and the transmit circuits are identical. In the receiver circuit 310, there are two amplifiers 312 and 314 both coupled to a switch 316. Amplifier 312 receives a bandpass filtered signal in frequency band RFB1 from a bandpass filter in the RF front end section 105 (FIG. 2), and similarly amplifier 314 receives a bandpass filtered signal in frequency band RFB2. The output of the switch 316 is coupled to a variable amplifier 318 to adjust the gain of the signal supplied to its input. The output of the variable amplifier 318 is coupled to mixers 320 and 322 that down-mix the amplified receive signal by IF local oscillator signals to produce I and Q signals. The output of mixer 320 is coupled to a lowpass filter 324, and the output of mixer 322 is coupled to a lowpass filter 326. The lowpass filters 324 and 326 are, for example, third order lowpass filters that may be located off-chip from the remainder of the transceiver components for better linearity. The outputs of lowpass filters 324 and 326 are coupled to variable lowpass filters 328 and 330, respectively. Variable lowpass filters 328 and 330 can be controlled to vary their cut-off frequency so as to select either a narrowband (e.g., 10 MHz) or a wideband (e.g., 40 MHz). The variable lowpass filters 328 and 330 are coupled to sample-and-hold circuits 332 and 334, respectively. The output of the sample-and-hold circuits 332 and 334 are baseband I and Q signals representing the signal detected by antenna 102. A switch 336 is controlled to alternately select between the baseband I and Q signals for coupling to a single ADC, saving the cost of a second ADC.

Receiver circuit 340 has components 342 through 366 which are the same as the components in receiver circuit 310. Receiver circuits 310 and 340 perform a direct-conversion or zero-intermediate frequency downconversion of the detected RF signals to baseband. To summarize, the first receiver circuit 310 has a first down-converter comprising quad mixers 320 and 322 that down-mix a first receive signal detected by, antenna 102 directly to baseband I and Q signals. Likewise, the second receiver-circuit 340 has a second downconverter comprising quad mixers 350 and 352 that down-mix a second receive signal detected by antenna 104 directly to baseband I and Q signals.

It will be appreciated by those with ordinary skill in the art that in the receiver circuits 310 and 340, quad mixers 320 and 322, and quad mixers 350 and 352 may be broadband mixers capable of covering both RFB1 and RFB2, or alternatively separate quad mixers may be provided for each RF band.

On the transmit side, transmit circuit 370 comprises first and second sample-and-hold circuits 372 and 374 that receive I and Q baseband signals for a first transmit signal from switch 371. The outputs-of the sample-and-hold circuits 372 and 374 are coupled to the variable lowpass filters 376 and 378. The outputs of the lowpass filters 376 and 378 are coupled to quad mixers 380 and 382, respectively. The quad mixers 380 and 382 up-mix the filtered I and Q signals output by the lowpass filters 376 and 378 to output RF I and Q signals which are combined and coupled to a variable amplifier 384. The variable amplifier 384 adjusts the gain of the first RF signal and supplies this signal to bandpass filters 386 and 388, associated with RFB1 and RFB2, respectively. The outputs of bandpass filters 386 and 388 are coupled to power amplifiers 394 and 396. Power amplifiers 390 and 392 amplify the RF signals for frequency bands RFB1 and RFB2 which are coupled to the RF front end 105.

Transmit circuit 400 has components 402 through 422 that are the same as those. in transmit circuit 370. The input to transmit circuit 400 consists of I and Q signals for a second transmit signal alternately supplied by switch 401. Thus, to summarize, the first transmit circuit 370 comprises an upconverter consisting of quad mixers 380 and. 382 that directly up-mix baseband I and Q signals to RF I and Q signals that are combined to form a first RF signal. The second transmit circuit 400 comprises an upconverter consisting of quad mixers 410 and 412 that directly up-mix baseband I and Q signals to RF I and Q signals that are combined to form a second RF signal. The variable lowpass filters in the receiver may be shared for transmit processing to remove the need for the variable lowpass filters in the transmitter.

A dual modulus phase-lock loop (PLL) 430, VCOs 432, 434 and 436, a squaring block 438 and a 90° phase shifter 440 may be provided to supply the appropriate in-phase and quadrature RF local oscillator signals to the mixers 320 and 322, respectively, in receiver circuit 310; mixers 350 and 352 in receiver circuit 370; mixers 380 and 382, respectively, in transmit circuit 370; and mixers 410 and 412, respectively, in transmit circuit 400. The dual modulus PLL 430 is a standard component for generating high frequency signals. The squaring block 438 acts as a frequency doubler, reducing pull of the VCO by the power amplifiers. For example, in order to provide RF mixing signals for the 2.4 GHz unlicensed band and the high and low 5 GHz unlicensed band, the VCO 432 produces an RF signal in the range 1200 through 1240 MHz, VCO 434 produces an RF signal in the range 2575 through 2675 MHz, and VCO 436 produces an RF signal in the range 2862 through 2912 MHz.

Like radio transceiver 100, there are control signals that are coupled to the appropriate components to control the operation. Radio transceiver 300 operates very similar to radio transceiver 100 or 100'. There are filter bandwidth control signals to control the variable lowpass filters in the receiver or transmitter depending on the bandwidth of operation of the transceiver 300. There are receive gain control signals to control the variable amplifiers 318 and 348. There are switch control signals to control the various switches in the radio transceiver 300 and front-end section, depending on whether it is in the receive mode or transmit mode, and depending on which band, RFB1 or RFB2, the transceiver is operating in. There are RF center frequency control signals to control the dual-modulus PLL 410 and VCOs 412–416 depending on which RF band and RF channel in that band the transceiver is operating in. There are transmit gain control signals to control the variable amplifiers 384 and 414 in the transmit circuits.

It should be understood that although the filter bandwidth control signals shown in FIGS. 2–4 are shown only coupled to the receiver circuits, these signals may also be coupled to the transmitter circuits to control the variable lowpass filters in the transmitter circuits, if the filter sharing techniques referred to herein are not employed.

Figure 6:
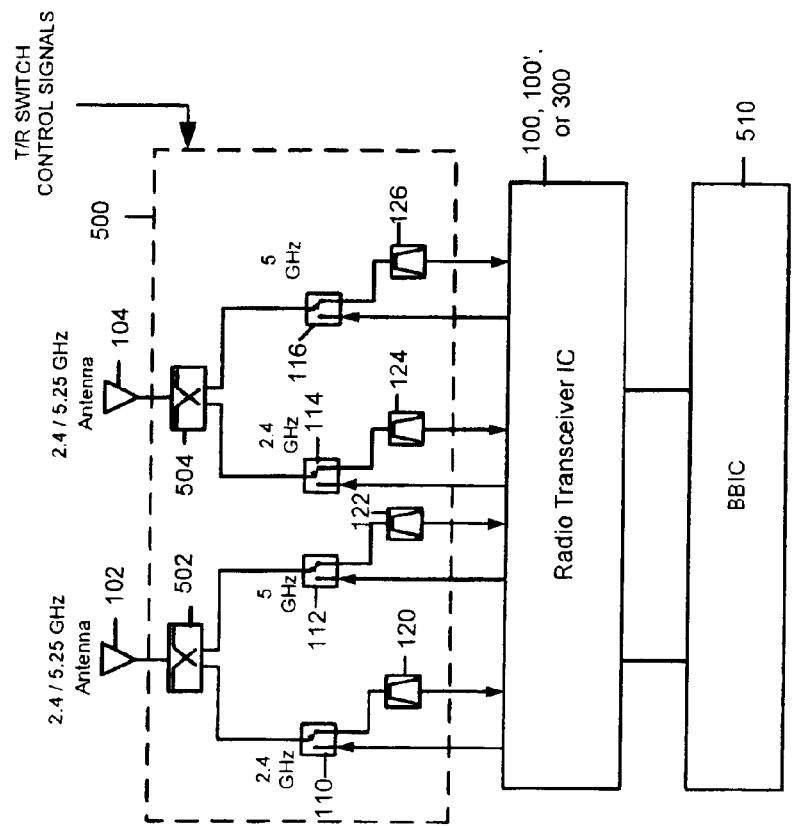

FIGS. 6–10 illustrate alternative front-end sections. In FIG. 6, the front-end 500 section comprises many of the same components as front-end section 105, albeit in a slightly different configuration. The LPFs 128, 130, 132 and 134 may be integrated on the radio transceiver IC or incorporated in the radio front-end 500. Instead of switches 106 and 108, diplexers 502 and 504 are used for band selection from the antennas 102 and 104. As known in the art, a diplexer is a 3-port device that has one common port and two other ports, one for high frequency signals and one for lower frequency signals. Thus, the diplexers 106 and 108 serve as band select switches. In the example of FIG. 6, the two bands that are supported are the 2.4 GHz band and the 5.25 GHz band. Switches 110, 112, 114 and 116 are transmit/receive switches that select the appropriate signals depending on whether the radio transceiver is transmitting or receiving. For example, when the radio transceiver is transmitting a signal in the 2.4 GHz band through antennas 102 and 104, the diplexer 502 receives the first 2.4 GHz transmit signal from switch 110 and couples it to the antenna 102, and the diplexer 504 receives the second 2.4 GHz transmit signal from switch 114 and couples it to antenna 104. All the other switch positions are essentially irrelevant.

Likewise, when receiving a signal in the 5.25 GHz band, diplexer 502 couples the first 5.25 GHz receive signal from antenna 102 to switch 112 and diplexer 504 couples the second 5.25 GHz receive signal from antenna 104 to switch 116. Switch 112 selects the output of the diplexer 502 and switch 116 selects the output of the diplexer 504.

Figure 7:
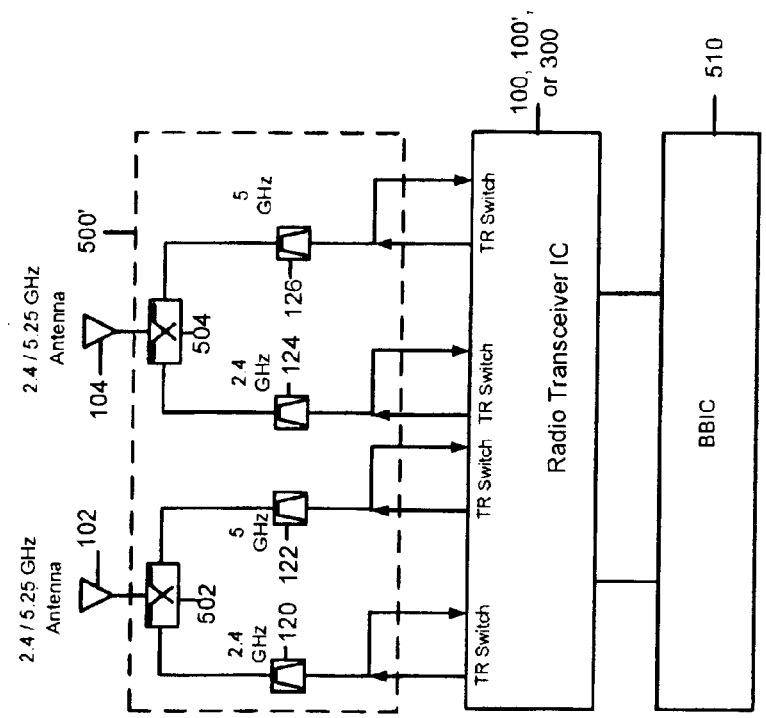
FIGS. 6–8 are schematic diagrams showing alternative radio front-end sections used with a MIMO radio transceiver.

As is known in the art, the radio transceiver is coupled to a baseband processor that may be a separate integrated circuit as shown by the baseband integrated circuit (BBIC) 510 in FIGS. 6 and 7.

Figure 8:
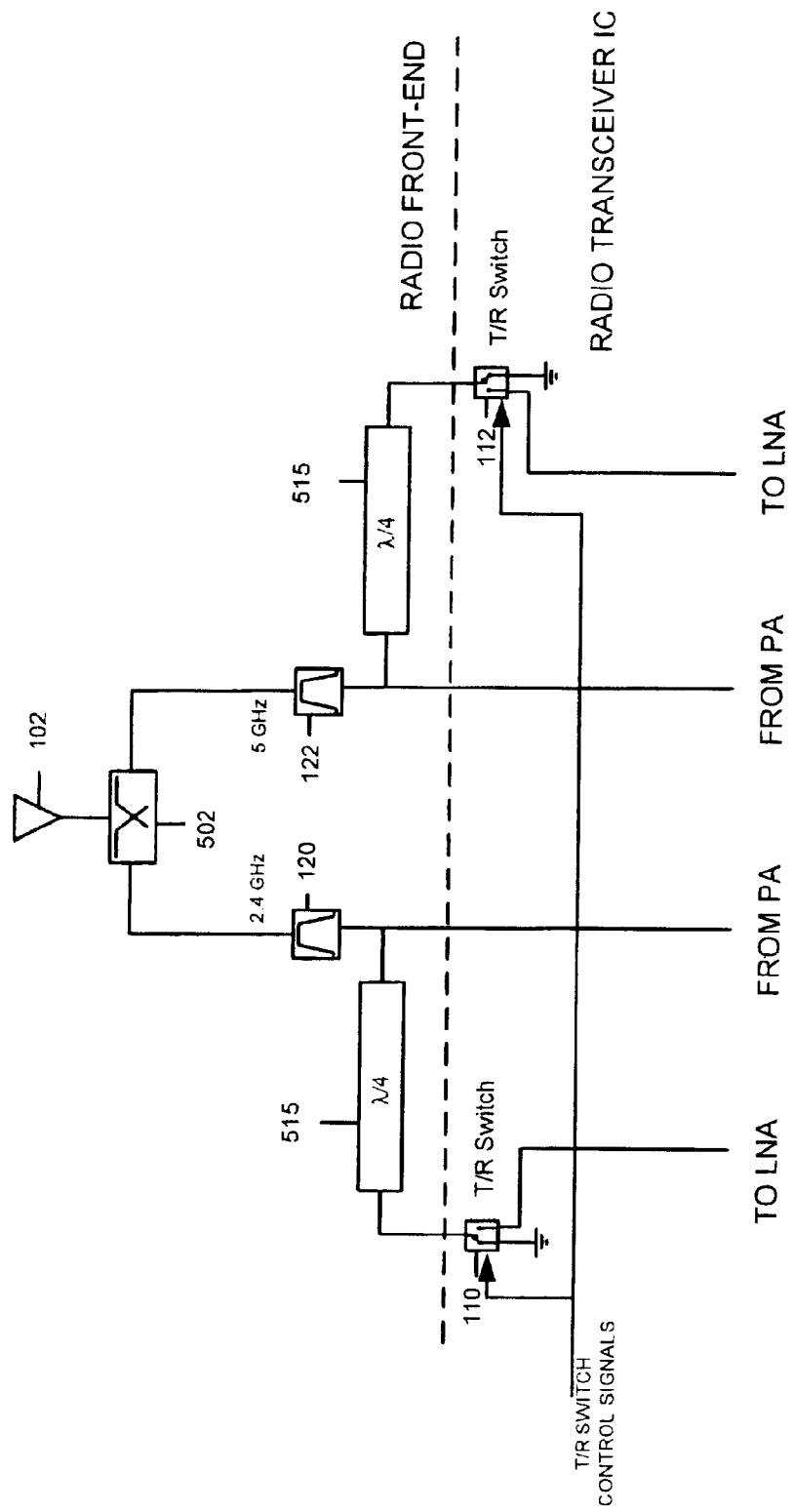

FIG. 7 illustrates a front-end section 500' that is similar to front-end section 500 except that the transmit/receive switches are effectively integrated on the radio transceiver IC. Many techniques are known to integrate switches similar to the transmit/receive switches on the radio transceiver IC. When the transmit/receive switches are integrated on the radio transceiver IC, for each antenna, a quarter-wave element 515 is provided in the radio front-end 500" at each band branch off of the diplexer for each antenna. FIG. 8 shows this configuration for one antenna 102 only as an example, but it is repeated for each antenna. When a signal is being transmitted, the transmit/receive switch is switched to the terminal that is connected to ground so that the signal output by the corresponding power amplifier (PA) of the transmitter is selected and coupled to the diplexer, and when a signal is received, it is switched to the other terminal so that the receive signal passes through the quarter-wave element 525, the transmit/receive switch and passes to the LNA in the receiver. The quarter-wave element 515 may be any quarter-wave transmission line. One example of an implementation of the quarter-wave element 515 is a microstrip structure disposed on a printed circuit board. The quarter-wavelength characteristic of the quarter-wave element 515 creates a phase shift that acts as an impedance transformer, either shorting the connection between the bandpass filter and ground, or creating an open circuit, depending on the position of the switch.

The radio transceiver IC and front-end configurations shown in FIGS. 6 and 7 are useful for network interface cards (NICs) to serve as an 802.11×WLAN station.

Figure 9:
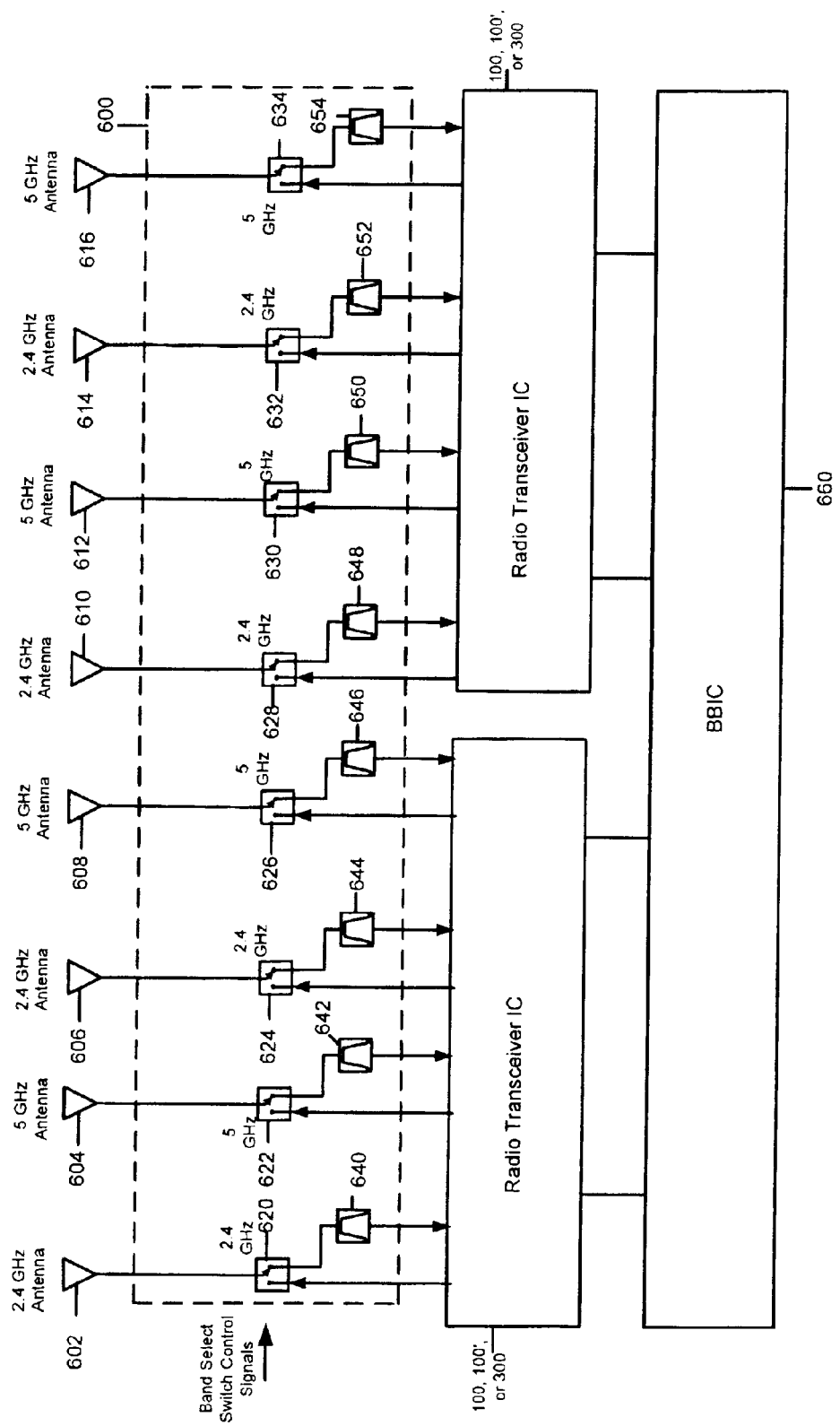
FIG. 9 is a schematic diagram of still another radio-front end useful in connection with two radio transceiver ICs in a single device to provide 4 transmit and receive paths.

FIG. 9 illustrates a front-end section 600 that interfaces with two radio transceiver ICs to provide a 4 path MIMO radio transceiver device. One example of a use for this type of configuration is in an access point (AP) for a WLAN. Whereas the radio transceiver configurations described up to this point were for 2-path MIMO operation, 4-path MIMO operation provides even greater link margin with other devices when used in connection with the maximal ratio combining schemes referred to above.

The front-end section 600 interfaces two radio transceiver ICs to eight antennas 602 through 616. A BBIC 660 is coupled to the two radio transceiver ICs that operate in tandem to transmit 4 weighted components of a single signal or to receive 4 components of a single received signal. Antennas 602, 606, 610 and 614 are dedicated to one frequency band, such as the 2.4 GHz band and antennas 604, 608, 612 and 616 are dedicated to another frequency band, such as a 5 GHz band. In the front-end section 600, there are transmit/receive switches eight 620 through 634 each associated with one of the antennas 602 through 616 respectively. There are also eight bandpass filters 640 through 654 coupled to respective ones of the transmit/receive switches 620 through 654. The transmit/receive switches 620 through 634 could be integrated on the respective radio transceiver ICs instead of being part of the front-end section 600. Though not specifically shown, the LPFs are also integrated on the radio transceiver ICs. Operation of the front-end section 600 is similar to what has been described above. The transmit/receive switches 620 through 654 are controlled to select the appropriate signals depending on whether the radio transceiver ICs are operating in a transmit mode or a receive mode.

Figure 10:
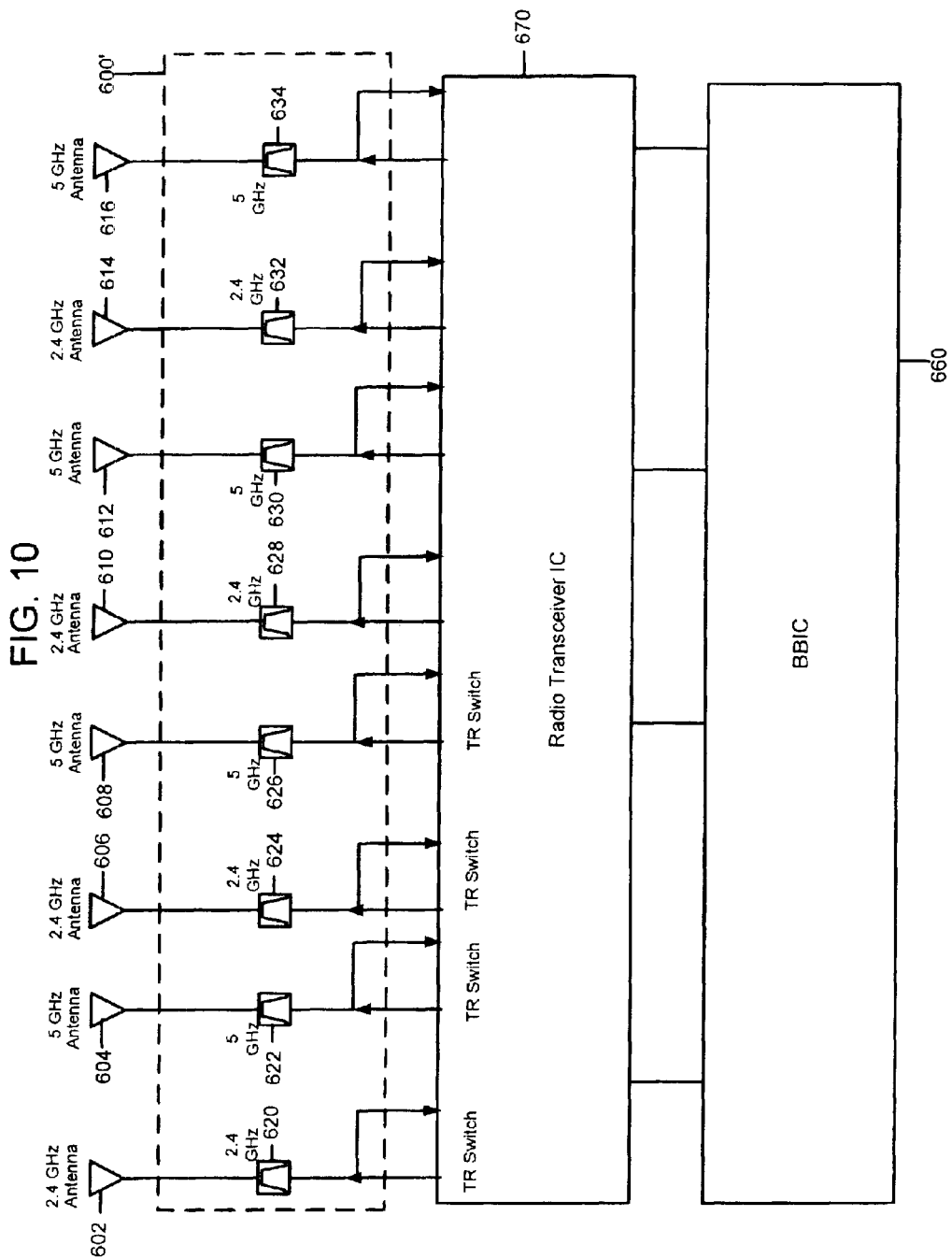
FIG. 10 is a schematic diagram of yet another radio front-end section useful in connection with a single radio transceiver IC that provides 4 transmit and receive paths.

FIG. 10 illustrates a front-end section 600' that is similar to front-end section 600 but excludes the transmit/receive switches. Moreover, the radio transceiver 670 is a single IC that integrates 4-paths (what is otherwise included on two radio transceiver ICs as shown in FIG. 9). The transmit/receive switches are integrated on the radio transceiver IC 670. The operation of the front-end section 600' is similar to that of front-end section 600. FIG. 10 illustrates the ability to scale the number of MIMO paths to 3, 4 or more separate paths.

FIGS. 9 and 10 also illustrate the radio transceivers 100, 100' and 300 deployed in multiple instances to support multiple channel capability in a communication device, such as an AP. For example, as shown in FIG. 9, one radio transceiver, such as an access point, could perform 2-path MIMO communication with devices on a channel while the other radio transceiver would perform 2-path MIMO communication with devices on another channel. Instead of interfacing to one baseband IC, each would interface to a separate baseband IC or a single baseband IC capable of dual channel simultaneous operation.

Figure 12:
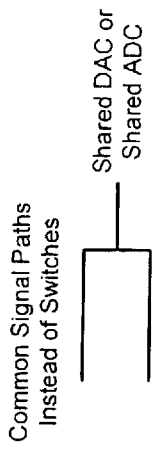
FIGS. 11 and 12 are diagrams showing how digital-to-analog converters and analog-to-digital converters may be shared in connection with a MIMO radio transceiver.
Figure 11:
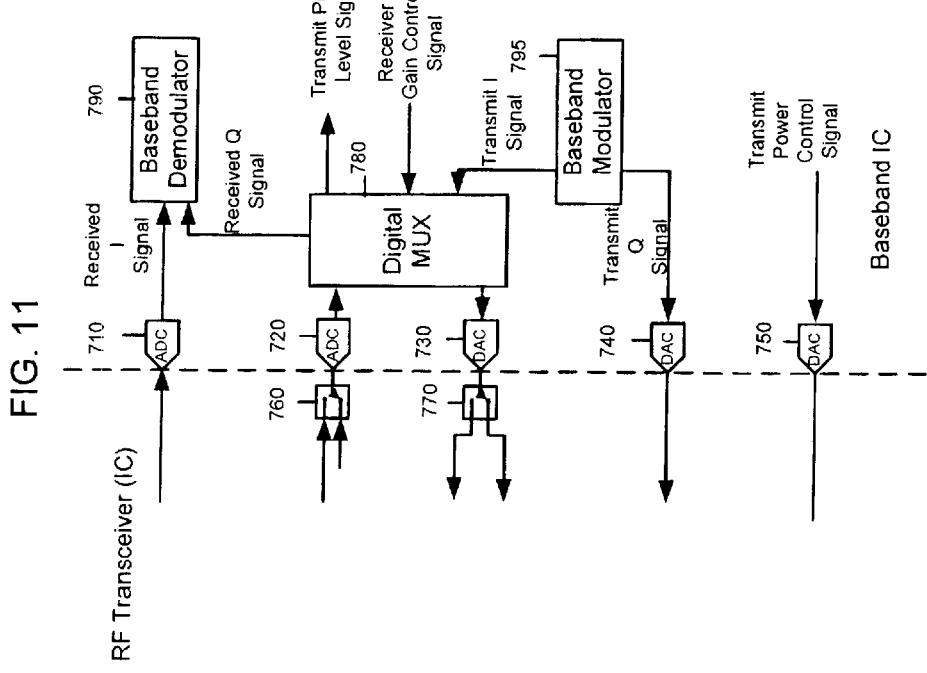

FIGS. 11 and 12 show a configuration whereby the number of DACs and ADCs that are coupled to the radio transceiver can be reduced. Normally, a separate DAC or ADC would be required for every signal that requires processing. However, in a half-duplex radio transceiver, since transmit and receive operations are not concurrent, there is opportunity for sharing DACs and ADCs. For example, FIG. 11 shows a configuration comprising two ADCs 710 and 720 and three DACs 730, 740 and 750. ADC 720 and DAC 730 are shared. Switch 760 selects input to the ADC 720 and switch 770 selects the output of the DAC 730. A digital multiplexer (MUX) 780 is coupled to the ADC 720 to route the output therefrom, and to the DAC 730 to coordinate input thereto. The ADCs, DACs and digital MUX 780 may reside on a separate integrated circuit from the radio transceiver integrated circuit. For example, these components may reside on the baseband integrated circuit where a baseband demodulator 790 and a baseband modulator 795 reside.

The number of ADCs is reduced by using a single ADC 720 to digitize both the received Q signal and the transmit power level signal. Similarly, the number of DACs is reduced by sharing a single DAC 730 to convert both the transmit I signal and the receiver gain control signal. The digital MUX 780 selects the signal (either the transmit I signal or the receiver gain control signal) that is supplied as input to the shared DAC 730. Similarly, the signal that is output by the shared ADC 720 (digital received Q signal or the digital transmit power level signal) is routed to the appropriate destination by the digital MUX 780.

As described above, one way to facilitate sharing of the ADC and the DAC is to provide switches 760 and 770. These switches may reside on the radio transceiver IC. An output terminal of switch 760 is coupled to the shared ADC 720, one input terminal is coupled to the LPF at the output of the local oscillator that generates the received Q signal and the other input terminal is coupled to the output of the power detector that generates the transmit power level signal. Switch 760 is controlled to select one of two positions, depending on whether the ADC is to be used for the received Q signal or the transmit power level signal. Likewise, an input terminal of switch 770 is coupled to the shared DAC 730, one output terminal is coupled to the variable power amplifier in the receiver and the other output terminal is coupled to the LPF that supplies a transmit I signal to the in-phase local mixer in the transmitter. Switch 770 is controlled to select one of two positions, depending on whether the shared DAC is to be used for the receiver gain control signal or the transmit I signal. The configuration shown in FIG. 11 can be repeated for each receive path/transmit path pair in the transceiver.

It should be understood that the switches 760 and 770 are optional. As shown in FIG. 12, they may be replaced with common signal paths if the radio transceiver IC is a half-duplex transceiver, meaning that the receiver and transmitter are not operational at the same time. Therefore, the shared DAC 730, for example, will convert whichever digital signal is supplied to it (the transmit I signal or the receiver gain control signal, depending on whether the transceiver is in receive mode or transmit mode), and the DAC 730 will output the analog version of that signal on both paths. If the transmit I signal is selected for processing by the shared DAC 730, the receiver will be off, so coupling a analog version of the transmit I signal to the variable power amplifier in the receive channel will have no effect, but it also will be coupled to the in-phase local oscillator in the transmitter, which is desired. A similar situation holds true if the switch for the shared ADC 720 is replaced with a common signal path configuration.

A single ADC and a single DAC can be shared among signals from the transmitter and receiver (since in a half-duplex transceiver, the transmitter and receiver are generally not operational at the same time). The signals that are identified above are only examples of the transmitter and receiver signals that may be multiplexed to a single ADC or single DAC.

Figure 13:
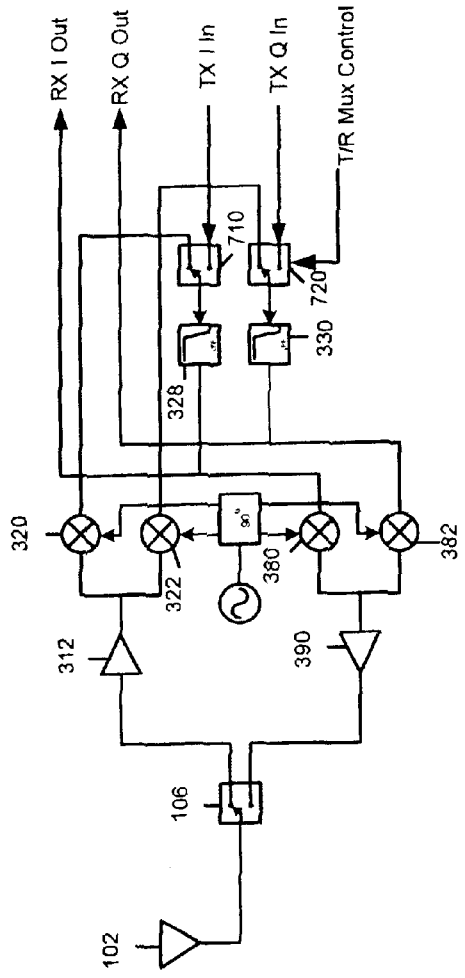
FIGS. 13 and 14 are diagrams showing how filters in the radio transceiver can be shared so as to reduce the area of an integrated circuit.
Figure 14:
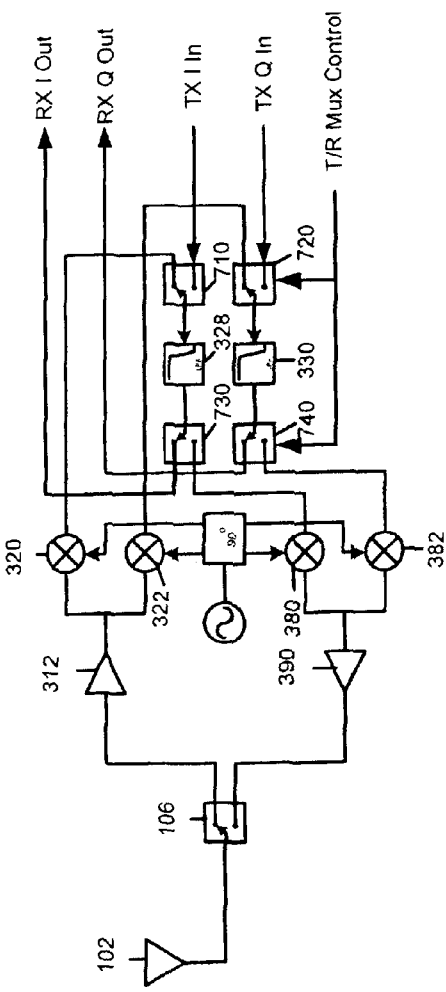

FIGS. 13 and 14 illustrate configurations that allow for sharing of the LPFs used to filter the baseband receive signals and baseband transmit signals in the radio transceivers of FIGS. 2–4. As an example, a single antenna path of the direct conversion radio transceiver 300 is selected to illustrate the filter sharing technique. Some intermediate components, such as variable amplifiers and sample-and-hold circuits, are not shown for simplicity. LPFs 328 and 330 are shared to both filter the received I and Q signals (RX I and RX Q) associated with an antenna, such as antenna 102, and filter the baseband transmit I and Q signals (TX I and TX Q) to be transmitted. The switches 710 and 720 each have two input terminals and an output terminal coupled to the input of the LPFs 328 and 330, respectively. Coupled to the input terminals of the switch 710 are the receive I signal output by the quad mixer 320 and the baseband transmit I signal. Similarly, coupled to the input terminals of the switch 720 are the receive Q signal output by the quad mixer 322 and the baseband transmit Q signal. A transmit/receive control signal is coupled to the switches 710 and 720 to cause the switches to select either their terminals to which the receive I and Q signals are connected or the terminals to which the transmit I and Q signals are connected. In FIG. 13, it is assumed that the output impedance at each filter is low and each load impedance is high (typical in most analog ICs) so that the output of each filter can be summed. Therefore, only a single multiplexer is needed at the input to the filters. The configuration of FIG. 14 is similar to FIG. 15, except that additional switches 730 and 740 are provided in case the impedances are not as described above.

In sum, a multiple-input multiple-output (MIMO) radio transceiver is provided comprising a receiver and a transmitter. The receiver comprises at least first and second receiver circuits each to process a signal from a corresponding one of first and second antennas. The first receiver circuit comprises a first downconverter coupled to the first antenna to downconvert a first receive signal detected by the first antenna to produce a first baseband signal; and a first lowpass filter coupled to the first downconverter that lowpass filters the first baseband signal. The second receiver circuit comprises a second downconverter coupled to the second antenna to downconvert a second receive signal detected by the second antenna to produce a second baseband signal; and a second lowpass filter coupled to the second downconverter that lowpass filters the second baseband signal. The transmitter comprises at least first and second transmitter circuits each of which processes a signal to be transmitted by a corresponding one of the first and second antennas. The first transmitter circuit comprising a first upconverter that upconverts a first baseband analog signal to generate a first RF frequency signal; a first bandpass filter coupled to the output of the first upconverter that filters the first RF frequency signal; and a first power amplifier coupled to the output of the bandpass filter that amplifies the filtered RF frequency signal to produce a first amplified signal that is coupled to the first antenna for transmission. Similarly, the second transmitter circuit comprises a second upconverter that upconverts a second baseband analog signal to generate a second RF frequency signal; a second bandpass filter coupled to the output of the second upconverter that filters the second RF frequency signal; and a second power amplifier coupled to the output of the second bandpass filter that amplifies the second filtered RF frequency signal to produce a second amplified signal that is coupled to the second antenna for transmission.

Similarly, a multiple-input multiple-output (MIMO) radio transceiver is provided comprising a receiver comprising at least first and second receiver circuits each to process a signal from a corresponding one of first and second antennas, and a transmitter. The first receiver circuit comprises a first downconverter coupled to the first antenna to downconvert a first receive signal detected by the first antenna to produce a first in-phase baseband signal and a first quadrature-phase baseband signal; and first and second lowpass filters coupled to the first downconverter that lowpass filter the first in-phase baseband signal and the first quadrature phase baseband signal, respectively. The second receiver circuit comprises a second downconverter coupled to the second antenna to downconvert a second receive signal detected by the second antenna to produce a second in-phase baseband signal and a second quadrature-phase baseband signal; and third and fourth lowpass filters coupled to the second downconverter that lowpass filter the second in-phase baseband signal and the second quadrature-phase baseband signal. The transmitter comprises at least first and second transmitter circuits each of which processes a signal to be transmitted by a corresponding one of the first and second antennas. The first transmitter circuit comprises a first upconverter that upconverts a first in-phase baseband analog signal and a first quadrature-phase baseband analog signal to generate a first RF frequency signal; a first bandpass filter coupled to the output of the first upconverter that filters the first RF frequency signal; and a first power amplifier coupled to the output of the first bandpass filter that amplifies the first filtered RF frequency signal to produce a first amplified signal that is coupled to the first antenna for transmission. The second transmitter circuit comprises a second upconverter that upconverts a second in-phase baseband analog signal and a second quadrature-phase baseband analog signal to generate a second RF frequency signal; a second bandpass filter coupled to the output of the second upconverter that filters the second RF frequency signal; and a second power amplifier coupled to the output of the second bandpass filter that amplifies the second filtered RF frequency signal to produce a second amplified signal that is coupled to the second antenna for transmission.

While the foregoing description has referred to a MIMO radio transceiver with two antennas, and thus two receiver circuits and two transmitter circuits, it should be understood that the same concepts described herein may be extended in general to a radio transceiver with N transmitter circuits and N transmitter circuits for operation with N antennas.

The above description is intended by way of example only.

What is claimed is:

1. A multiple-input multiple-output (MIMO) radio transceiver comprising:

a. a receiver comprising at least first and second receiver circuits each to process a signal from a corresponding one of first and second antennas,
   i. the first receiver circuit comprising:
     1. a first downconverter coupled to the first antenna to downconvert a first receive signal detected by the first antenna to produce a first baseband signal; and
     2. a first lowpass filter coupled to the first downconverter that lowpass filters the first baseband signal;
   ii. the second receiver circuit comprising:
     1. a second downconverter coupled to the second antenna to downconvert a second receive signal detected by the second antenna to produce a second baseband signal; and 2. a second lowpass filter coupled to the second downconverter that lowpass filters the second baseband signal;

b. a transmitter comprising at least first and second transmitter circuits each of which processes a signal to be transmitted by a corresponding one of the first and second antennas, i. the first transmitter circuit comprising:

1. a first upconverter that upconverts a first baseband analog signal to generate a first RF signal;
2. a first bandpass filter coupled to the output of the first upconverter that filters the first RF signal; and
3. a first power amplifier coupled to the output of the bandpass filter that amplifies the filtered RF signal to produce a first amplified signal that is coupled to the first antenna for transmission;

ii. the second transmitter circuit comprising:

1. a second upconverter that upconverts a second baseband analog signal to generate a second RF signal;
2. a second bandpass filter coupled to the output of the second upconverter that filters the second RF signal; and
3. a second power amplifier coupled to the output of the second bandpass filter that amplifies the second filtered RF signal to produce a second amplified signal that is coupled to the second antenna for transmission.

2. The radio transceiver of claim 1, wherein the first receiver circuit and the second receiver circuit process the first and second receive signals substantially simultaneously to allow for combining of signals resulting from processing by the first and second receiver circuits.

3. The radio transceiver of claim 1, wherein the first transmitter circuit and the second transmitter circuit process the first and second analog baseband signals for transmission substantially simultaneously.

4. The radio transceiver of claim 1, and further comprising a frequency synthesizer that produces an RF local oscillator signal that is coupled to each of the first and second downconverters to be mixed with the first and second receive signals, respectively, wherein the RF local oscillator signal may be at any frequency within one or more discrete radio frequency bands.

5. The radio transceiver of claim 4, wherein the frequency synthesizer couples the RF local oscillator signal to the first and second upconverters to upmix the first and second baseband analog signals, respectively.

6. The radio transceiver of claim 1, wherein the first and second receiver circuits and the first and second transmitter circuits are implemented on a single semiconductor integrated circuit.

7. The radio transceiver of claim 1, wherein the first receiver circuit further comprises a first sample-and-hold circuit coupled to the output of the first lowpass filter and the second receiver circuit further comprises a second sample-and-hold circuit coupled to the output of the second lowpass filter.

8. The radio transceiver of claim 1, wherein the first and second downconverters comprise a single stage mixing process to downconvert the first and second receive signals directly to baseband.

9. The radio transceiver of claim 1, wherein the first and second downconverters comprise a two stage mixing process to downconvert the first and second receive signals to first and second intermediate frequency signals at a common intermediate frequency, and then to first and second baseband signals.

10. The radio transceiver of claim 9, and further comprising a frequency synthesizer that supplies an RF local oscillator signal and an IF local oscillator signal to the first and second downconverters, wherein the IF local oscillator signal is derived from the RF local oscillator signal that is also supplied to the first and second downconverters.

11. The radio transceiver of claim 1, wherein the first lowpass filter of the first receiver circuit and the second lowpass filter of the second receiver circuit are variable lowpass filters that are responsive to a bandwidth control signal so as to pass a portion of a radio frequency band or substantially the entire radio frequency band.

12. The radio transceiver of claim 1, wherein the first upconverter and the second upconverter comprise first and second lowpass filters to filter the first and second baseband analog signals, respectively, prior to upconversion, wherein the first and second lowpass filters are variable lowpass filters that are responsive to a bandwidth control signal so as to filter the first and second baseband analog signals for transmission in a portion of the radio frequency band, or in substantially the entire radio frequency band.

13. The radio transceiver of claim 1, wherein the first downconverter comprises first and second RF mixers, wherein the first RF mixer down-mixes the first receive signal to an intermediate frequency signal when the first receive signal is in a first radio frequency band and the second RF mixer down-mixes the first receive signal to an intermediate frequency signal when the first receive signal is in a second radio frequency band, and wherein the second downconverter comprises first and second RF mixers, wherein the first RF mixer down-mixes the second receive signal to an intermediate frequency signal when the second receive signal is in a first radio frequency band and the second RF mixer down-mixes the second receive signal to an intermediate frequency signal when the second receive signal is in the second radio frequency band.

14. A multiple-input multiple-output (MIMO) radio transceiver comprising:

a. a receiver comprising at least first and second receiver circuits each to process a signal from a corresponding one of first and second antennas, i. the first receiver circuit comprising:

1. a first downconverter coupled to the first antenna to downconvert a first receive signal detected by the first antenna to produce a first in-phase baseband signal and a first quadrature baseband signal; and
2. first and second lowpass filters coupled to the first downconverter that lowpass filter the first in-phase baseband signal and the first quadrature baseband signal, respectively;

ii. the second receiver circuit comprising:

1. a second downconverter coupled to the second antenna to downconvert a second receive signal detected by the second antenna to produce a second in-phase baseband signal and a second quadrature baseband signal; and
2. third and fourth lowpass filters coupled to the second downconverter that lowpass filter the second in-phase baseband signal and the second quadrature baseband signal, respectively;

b. a transmitter comprising at least first and second transmitter circuits each of which processes a signal to be transmitted by a corresponding one of the first and second antennas, i. the first transmitter circuit comprising:
   1. a first upconverter that upconverts a first in-phase baseband analog signal and a first quadrature baseband analog signal to generate a first RF signal;
   2. a first bandpass filter coupled to the output of the first upconverter that filters the first RF signal; and
   3. a first power amplifier coupled to the output of the first bandpass filter that amplifies the first filtered RF signal to produce a first amplified signal that is coupled to the first antenna for transmission;
  ii. the second transmitter circuit comprising:
   1. a second upconverter that upconverts a second in-phase baseband analog signal and a second quadrature baseband analog signal to generate a second RF signal;
   2. a second bandpass filter coupled to the output of the second upconverter that filters the second RF signal; and
   3. a second power amplifier coupled to the output of the second bandpass filter that amplifies the second filtered RF signal to produce a second amplified signal that is coupled to the second antenna for transmission.

15. The radio transceiver of claim 14, wherein the first downconverter comprises first and second RF mixers, wherein the first RF mixer down-mixes the first receive signal to an intermediate frequency signal when the first receive signal is in a first radio frequency band and the second RF mixer down-mixes the first receive signal to an intermediate frequency signal when the first receive signal is in a second radio frequency band, and wherein the second downconverter comprises first and second RF mixers, wherein the first RF mixer down-mixes the second receive signal to an intermediate frequency signal when the second receive signal is in a first radio frequency band and the second RF mixer down-mixes the second receive signal to an intermediate frequency signal when the second receive signal is in the second radio frequency band.

16. The radio transceiver of claim 15, wherein the first downconverter further comprises a pair of quad mixers coupled to the output of the first and second RF mixers to further down-mix the intermediate frequency signal to the first in-phase and quadrature baseband signals representative of the first receive signal, and the second downconverter further comprises a pair of quad mixers coupled to the output of the first and second RF mixers to further down-mix the intermediate frequency signal to the second in-phase and quadrature baseband signals representative of the second receive signal.

17. The radio transceiver of claim 16, and further comprising an RF frequency synthesizer that generates an RF local oscillator signal for the RF mixers in the first and second downconverters and wherein an intermediate frequency local oscillator signal used by the quad mixers in the first and second downconverters is derived from the RF local oscillator signal.

18. The radio transceiver of claim 17, and further comprising a divide-by-four circuit that divides the frequency of the RF local oscillator signal to generate the intermediate frequency local oscillator signal that is coupled to the quad mixers in the first and second downconverters.

19. The radio transceiver of claim 16, and further comprising an RF frequency synthesizer that generates an RF local oscillator signal for the RF mixers and an intermediate frequency synthesizer that generates an intermediate frequency local oscillator signal for the quad mixers in the first and second downconverters.

20. The radio transceiver of claim 14, wherein the first downconverter comprises a pair of quad mixers that down-mix the first receive signal directly to the first in-phase and quadrature baseband signals, and the second downconverter comprises a pair of quad mixers that down-mix the second receive signal directly to the second in-phase and quadrature baseband signals.

21. The radio transceiver of claim 20, wherein the first and second receiver circuits each further comprise a variable amplifier coupled to amplify an intermediate frequency signal before it is supplied to their quad mixers.

22. The radio transceiver of claim 14, wherein the first upconverter comprises a pair of quad mixers that up-mix the first baseband in-phase and quadrature signals to an intermediate frequency signal, the second upconverter comprises a pair of quad mixers that up-mix the second baseband in-phase and quadrature signals to an intermediate frequency signal.

23. The radio transceiver of claim 22, wherein the first upconverter further comprises an RF mixer coupled to the output of the quad mixers that up-mixes the intermediate frequency signal to a first RF signal, and the second upconverter further comprises an RF mixer coupled to the output of the quad mixers that up-mixes the intermediate frequency signal to a second RF signal.

24. The radio transceiver of claim 23, wherein the first and second transmitter circuits each further comprises a variable amplifier coupled to amplify the intermediate frequency signal before it is supplied to their RF mixers.

25. The radio transceiver of claim 23, wherein the first and second transmitter circuits further comprise first and second bandpass filters coupled to the output of their RF mixers, that are dedicated to bandpass filtering signals to be transmitted in a first radio frequency band, and third and fourth bandpass filters coupled to the RF mixers to filter signals to be transmitted in a second radio frequency band.

26. The radio transceiver of claim 14, wherein the first receiver circuit comprises first and second sample-and-hold circuits that are connected to the first and second lowpass filters, respectively, to couple the first in-phase baseband signal and the first quadrature baseband signal to an analog-to-digital converter, and the second receiver circuit comprises third and fourth sample-and-hold circuits that are connected to the third and fourth lowpass filters, respectively, to couple the second in-phase baseband signal and the second quadrature baseband signal to an analog-to-digital converter.

27. The radio transceiver of claim 14, wherein the receiver and the transmitter are implemented on a single semiconductor integrated circuit.

28. The radio transceiver of claim 14, wherein the first receiver circuit and the second receiver circuit process the first and second signals substantially simultaneously to allow for combining of signals resulting from processing by the first and second receiver circuits.

29. The radio transceiver of claim 14, wherein the first transmitter circuit and the second transmitter circuit process the first and second analog baseband signals for transmission substantially simultaneously.

30. The radio transceiver of claim 14, wherein the first, second, third and fourth lowpass filters are variable lowpass filters that are responsive to a bandwidth control signal so as to pass a portion of a radio frequency band or to pass substantially the entire radio frequency band.

31. The radio transceiver of claim 30, wherein the first and second variable lowpass filters receive as input the first in-phase baseband analog signal and the first quadrature baseband analog signal, respectively, and the third and fourth lowpass filters receive as input the second in-phase baseband analog signal and the second quadrature baseband analog signal, respectively, to filter these signals for transmission in a portion of the radio frequency band, or in substantially the entire radio frequency band.

32. The radio transceiver of claim 14, wherein the first transmitter circuit comprises first and second variable lowpass filters to filter the first in-phase and quadrature signals prior to upconversion and the second transmitter circuit comprises third and fourth variable lowpass filters to filter the second in-phase and quadrature signals prior to upconversion, wherein the first, second, third and fourth variable lowpass filters in the first and second transmitter circuits are variable lowpass filters that are responsive to a bandwidth control signal so as to filter the first and second baseband analog signals for transmission in a portion of a radio frequency band, or in substantially the entire radio frequency band.

33. The radio transceiver of claim 14, wherein the first downconverter and the second downconverter downconvert the first and second receive signals, respectively, directly to baseband in a single stage downconversion process.

34. In combination, the radio transceiver of claim 14, and further comprising:
   a. an analog-to-digital converter (ADC);
   b. a digital-to-analog converter (DAC); and
   c. a digital multiplexer coupled to the ADC and to the DAC;
   d. wherein the ADC receives as input one of: an analog transmit power level signal, first or second quadrature baseband analog signal, first or second in-phase baseband analog signal; and wherein the DAC receives as input one of: first or second digital quadrature transmit signal, first or second digital in-phase transmit signal, digital receiver gain control signal, and wherein the digital multiplexer directs signals from the ADC to their appropriate destination and directs appropriate ones of the signals to the DAC for digital-to-analog conversion.

35. The combination of claim 34, and further comprising a first switch having first and second input terminals and an output terminal, the output terminal of the first switch being coupled to the input of the ADC, the first and second input terminals of the first switch being coupled to any two signals of: the analog transmit power level signal, first or second quadrature baseband analog signal, and the first or second in-phase baseband analog signal, and a second switch having first and second output terminals and an input terminal, the input terminal of the second switch being coupled to the output of the DAC, and wherein the digital multiplexer directs one of the following signals to the input of the DAC: the first or second digital quadrature transmit signal, first or second digital in-phase transmit signal, and the digital receiver gain control signal.

36. In combination, the radio transceiver of claim 14, and a radio front-end section comprising:
   a. a first transmit/receive switch to be coupled to the first antenna and a second transmit/receive switch to be coupled to the second antenna, wherein the first and second transmit/receive switches each comprise an antenna terminal to be coupled to the first and second antenna, respectively, a receive output terminal and a transmit input terminal, the transmit input terminals of the first and second transmit/receive switches being coupled to the output of the first and second transmitter circuits, respectively, wherein the first and second transmit/receive switches are responsive to a control signal to select one of the two output terminals; and
   b. first and second bandpass filters, the first bandpass filter coupled to the receive output terminal of the first transmit/receive switch and the second bandpass filter coupled to the receive output terminal of the second transmit/receive switch, the first and second bandpass filters filter the signals detected by the first and second antennas, respectively, to produce the first and second receive signals.

37. The combination of claim 36, wherein the first and second bandpass filters are dedicated to filtering signals in a first radio frequency band, and further comprising:
   a. third and fourth bandpass filters dedicated to filtering signals in a second radio frequency band;
   b. first and second band select switches, the first and second band selection switches having an input terminal coupled to the receive output terminals of the first and second transmit/receive switches, respectively, and each having a first output terminal coupled to the first and second bandpass filters, respectively, and a second output terminal coupled to the third and fourth bandpass filters, respectively.

38. The combination of claim 37, wherein the radio front-end section further comprises third and fourth band select switches, each having first and second input terminals, and an output terminal, the output terminal of the third and fourth band select switches being coupled to the transmit input terminals of the first and second transmit/receive switches.

39. The combination of claim 38, wherein the radio front-end section further comprises first and second lowpass filters dedicated to filtering signals to be transmitted in the first radio frequency band, the outputs of the first and second lowpass filters being connected to the first input terminals of the third and fourth band select switches, respectively, and third and fourth lowpass filters dedicated to filtering signals to be transmitted in the second radio frequency band, the outputs of the third and fourth lowpass filters being connected to the second input terminals of the third and fourth band select switches.

40. In combination, the radio transceiver of claim 14, and a radio front-end section, wherein the radio front end section comprises a first diplexer to be coupled to the first antenna and a second diplexer to be coupled to the second antenna, wherein the first and second diplexers each have first and second branches onto which signals from first and second radio frequency bands, respectively, are coupled for transmission via the first and second antennas, respectively, or are coupled when received by the first and second antennas, respectively.

41. The combination of claim 40, wherein for each diplexer, the radio front-end section further comprises a bandpass filter coupled in the first branch to filter signals received in the first frequency band and a bandpass filter coupled in the second branch to filter signals received in the second frequency band.

42. The combination of claim 41, wherein the radio-front end section further comprises a transmit/receive switch coupled to the bandpass filter in each of the first and second branches for each diplexer, wherein the transmit/receive switch selects either a signal to be transmitted through an antenna coupled to the associated diplexer, or a signal detected by an antenna coupled to the associated diplexer which is coupled to the bandpass filter for that branch.

43. The combination of claim 41, wherein the radio transceiver further comprises a transmit/receive switch coupled to the bandpass filter in each of the first and second branches for each diplexer, wherein the transmit/receive switch selects either a signal to be transmitted through an antenna coupled to the associated diplexer, or a signal detected by an antenna coupled to the associated diplexer which is coupled to the bandpass filter for that branch.

44. The combination of claim 43, wherein the radio front-end section further comprises a quarter wavelength element coupled between the transmit/receive switch and the bandpass filter in each of the first and second branches for each diplexer.

45. A multiple-input multiple-output (MIMO) radio transceiver on a single semiconductor integrated circuit, comprising:
 a. a receiver comprising at least first and second receiver circuits each to process a signal from a corresponding one of first and second antennas,
  i. the first receiver circuit comprising:
   1. a first downconverter coupled to the first antenna to downconvert a first receive signal detected by the first antenna to produce a first baseband signal; and
   2. a first lowpass filter coupled to the first downconverter that lowpass filters the first baseband signal;
  ii. the second receiver circuit comprising:
   1. a second downconverter coupled to the second antenna to downconvert a second receive signal detected by the second antenna to produce a second baseband signal; and
   2. a second lowpass filter coupled to the second downconverter that lowpass filters the second baseband signal;
 b. a transmitter comprising at least first and second transmitter circuits each of which processes a signal to be transmitted by a corresponding one of the first and second antennas,
  i. the first transmitter circuit comprising:
   1. a first upconverter that upconverts a first baseband analog signal to generate a first RF signal; and
   2. a first bandpass filter coupled to the output of the first upconverter that filters the first RF signal;
  ii. the second transmitter circuit comprising:
   1. a second upconverter that up converts a second baseband analog signal to generate a second RF signal; and
   2. a second bandpass filter coupled to the output of the second upconverter that filters the second RF signal.

46. The radio transceiver of claim 45, wherein the first receiver circuit and the second receiver circuit process the first and second receive signals substantially simultaneously to allow for combining of signals resulting from processing by the first and second receiver circuits.

47. The radio transceiver of claim 45, wherein the first transmitter circuit and the second transmitter circuit process the first and second analog baseband signals for transmission substantially simultaneously.

48. The radio transceiver of claim 45, and further comprising a frequency synthesizer that produces an RF local oscillator signal that is coupled to each of the first and second downconverters to be mixed with the first and second receive signals, respectively, wherein the RF local oscillator signal may be at any frequency within one or more discrete radio frequency bands.

49. The radio transceiver of claim 48, wherein the frequency synthesizer couples the RF local oscillator signal to the first and second upconverters to upmix the first and second baseband analog signals, respectively.

50. The radio transceiver of claim 45, wherein the first and second downconverters comprise a single stage mixing process to downconvert the first and second receive signals directly to baseband.

51. The radio transceiver of claim 50, wherein the first downconverter comprises a pair of quad mixers that down-mix the first receive signal directly to first in-phase and quadrature baseband signals, and the second downconverter comprises a pair of quad mixers that down-mix the second receive signal directly to the second in-phase and quadrature baseband signals.

52. The radio transceiver of claim 45, wherein the first lowpass filter of the first receiver circuit and the second lowpass filter of the second receiver circuit are variable lowpass filters that are responsive to a bandwidth control signal so as to pass a portion of a radio frequency band or substantially the entire radio frequency band.

53. The radio transceiver of claim 45, wherein the first upconverter and the second upconverter comprise first and second lowpass filters to filter the first and second baseband analog signals, respectively, prior to upconversion, wherein the first and second lowpass filters are variable lowpass filters that are responsive to a bandwidth control signal so as to filter the first and second baseband analog signals for transmission in a portion of the radio frequency band, or in substantially the entire radio frequency band.

54. The radio transceiver of claim 45, and further comprising a first power amplifier in the first transmitter circuit coupled to the output of the first upconverter that amplifies the first RF signal and a second power amplifier in the second transmitter circuit coupled to the output of the second upconverter that amplifies the second RF signal.

55. A multiple-input multiple-output (MIMO) radio transceiver on a single semiconductor integrated circuit, comprising:
 a. a receiver comprising at least first and second receiver circuits each to process a signal from a corresponding one of first and second antennas, the first receiver circuit comprising a first downconverter that downconverts a first receive signal detected by the first antenna to produce a first baseband signal, the second receiver circuit comprising a second downconverter that downconverts a second receive signal detected by the second antenna to produce a second baseband signal;
 b. a transmitter comprising at least first and second transmitter circuits each of which processes a signal to be transmitted by a corresponding one of the first and second antennas, the first transmitter circuit comprising a first upconverter that upconverts a first baseband analog signal to generate a first RF signal, the second transmitter circuit comprising a second upconverter that upconverts a second baseband analog signal to generate a second RF signal.

56. The radio transceiver of claim 55, and further comprising a first power amplifier in the first transmitter circuit coupled to the output of the first upconverter that amplifies the first RF signal and a second power amplifier in the second transmitter circuit coupled to the output of the second upconverter that amplifies the second RF signal.

57. The radio transceiver of claim 55, and further comprising a first bandpass filter coupled between the output of the first upconverter and an input to the first power amplifier that filters the first RF signal, and a second bandpass filter coupled between the output of the second upconverter and an input to the second power amplifier that filters the second RF signal.

58. The radio transceiver of claim 55, wherein the first receiver circuit and the second receiver circuit process the first and second receive signals, respectively, substantially simultaneously to allow for combining of signals resulting from processing by the first and second receiver circuits.

59. The radio transceiver of claim 55, wherein the first transmitter circuit and the second transmitter circuit process the first and second analog baseband signals, respectively, for transmission substantially simultaneously.

60. The radio transceiver of claim 55, and further comprising a local oscillator that produces an RF local oscillator signal that is coupled to each of the first and second downconverters to be mixed with the first and second receive signals, respectively.

61. The radio transceiver of claim 60, wherein the local oscillator produces an RF local oscillator signal that is coupled to the first and second upconverters to upmix the first and second baseband analog signals, respectively.

62. The radio transceiver of claim 55, wherein the first and second downconverters downconvert the first and second receive signals directly to baseband.

63. The radio transceiver of claim 55, wherein each of the first and second downconverters comprises an RF mixer that down-mixes the first and second receive signals, respectively, to an intermediate frequency signal, and a pair of quad mixers that down-mix the intermediate frequency signal to in-phase and quadrature baseband signals.

64. The radio transceiver of claim 55, wherein each of the first and second receiver circuits further comprises a lowpass filter coupled to the output of the first and second downconverters, respectively, wherein each lowpass filter is a variable lowpass filter that is responsive to a bandwidth control signal so as to pass a portion of a radio frequency band or substantially the entire radio frequency band.

65. The radio transceiver of claim 55, and further comprising first and second lowpass filters, the first lowpass filter having inputs and an output and being shared by the first transmitter circuit and first receiver circuit, to filter either the first baseband analog signal that is output to the first transmitter circuit or to filter the first baseband signal produced by the first receiver circuit, and the second lowpass filter having inputs and an output and being shared by the second transmitter circuit and second receiver circuit to filter either the second baseband analog signal that is output to the second transmitter circuit or to filter the second baseband signal produced by the second receiver circuit, and further comprising a first switch having an output coupled to an input of the first lowpass filter and that couples to the input of the first lowpass filter either the first baseband analog signal or the first baseband signal, and a second switch having an output coupled to an input of the second lowpass filter and that couples to the input of the second lowpass filter either the second baseband analog signal or the second baseband signal.

\* \* \* \* \*

UNITED STATES PATENT AND TRADEMARK OFFICE
CERTIFICATE OF CORRECTION

PATENT NO. : 6,728,517 B2
DATED : April 27, 2004
INVENTOR(S) : Gary L. Sugar, Robert M. Masucci and David G. Rahn It is certified that error appears in the above-identified patent and that said Letters Patent is hereby corrected as shown below:

Title Page,
Item [56], References Cited, OTHER PUBLICATIONS, replace "Hiughly" with -- Highly --; replace "Berkley" with -- Berkeley --; and replace "Angelese" with -- Angeles --.

Column 3,
Line 60, delete "." between "signals" and "for".

Column 5,
Line 14, between "bands." and "and", as the beginning of a new paragraph add -- As shown in Fig. 5 , the radio transceiver 100 is designed to be coupled to first --.

Column 12,
Line 15, rewrite "500 section" to -- section 500 --.
Line 55, rewrite "500" to -- 500' --.

Column 13,
Line 10, add a character space between "802.11x" and "WLAN".
Line 29, insert -- eight -- at the beginning of the line and delete "eight" between "switches" and "620".
Lines 33 and 39, replace "654" with -- 634 --.

Column 23,
Line 43, replace "up converts" with -- upconverts --.

Signed and Sealed this

Twenty-ninth Day of June, 2004

JON W. DUDAS
*Acting Director of the United States Patent and Trademark Office*